US011626184B2

(12) United States Patent
Tsai

(10) Patent No.: US 11,626,184 B2
(45) Date of Patent: Apr. 11, 2023

(54) APPARATUS FOR TESTING SEMICONDUCTOR DEVICE AND METHOD OF TESTING THEREOF

(71) Applicant: NANYA TECHNOLOGY CORPORATION, New Taipei (TW)

(72) Inventor: Chen-Yen Tsai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 327 days.

(21) Appl. No.: 16/865,949

(22) Filed: May 4, 2020

(65) Prior Publication Data

US 2021/0343360 A1 Nov. 4, 2021

(51) Int. Cl.
*G11C 29/56* (2006.01)
*G01K 13/02* (2021.01)
*G01K 13/024* (2021.01)

(52) U.S. Cl.
CPC ........ *G11C 29/56016* (2013.01); *G01K 13/02* (2013.01); *G01K 13/024* (2021.01); *G11C 2029/5602* (2013.01)

(58) Field of Classification Search
CPC ...... G11C 29/56016; G11C 2029/5602; G01K 13/02; G01K 13/024; G01R 1/02; G01R 31/2601; G01R 31/2891; G01R 31/275; H01L 21/67333; H04B 10/0731
USPC .......... 324/500, 600, 76.11, 750.03–750.11, 324/750.22–750.26, 757.1–758.1
See application file for complete search history.

(56) References Cited

U.S. PATENT DOCUMENTS

| 2018/0308736 A1* | 10/2018 | Ramaswamy | .... H01L 21/68757 |
| 2019/0164851 A1* | 5/2019 | Yoo | .................... G01R 31/2879 |
| 2021/0208194 A1* | 7/2021 | Kasai | ................. G01R 31/2879 |

FOREIGN PATENT DOCUMENTS

TW 200426965 A 12/2004
TW 201901171 A 1/2019

OTHER PUBLICATIONS

Office Action of TW Application No. 11021183300 and Enlish translation, dated Dec. 1, 2021, 10 pages.

* cited by examiner

*Primary Examiner* — Lee E Rodak
*Assistant Examiner* — Trung Q Nguyen
(74) *Attorney, Agent, or Firm* — Muncy, Geissler, Olds & Lowe, P.C.

(57) ABSTRACT

An apparatus for performing thermal testing of a memory device and a method of thermally testing the memory device. The apparatus includes a tester; an interface board disposed over the tester and configured to receive the semiconductor device and connect the semiconductor device to the tester; a shield disposed over the interface board and including a recess; a gas-supplying unit including a conduit extending through the shield and accessible to the recess; a temperature-sensing device disposed within the recess; and a controller configured to control and communicate with the tester, the gas-supplying unit and the temperature-sensing device.

20 Claims, 21 Drawing Sheets

APPARATUS FOR TESTING SEMICONDUCTOR DEVICE AND METHOD OF TESTING THEREOF

TECHNICAL FIELD

The present disclosure relates to an apparatus for testing of a semiconductor device, and a method of testing the semiconductor device. Particularly, the present disclosure relates to an apparatus for performing thermal testing of a memory device, and a method of thermally testing the memory device.

DISCUSSION OF THE BACKGROUND

After fabrication, a semiconductor device, such as a die or a package, is tested by a testing unit (e.g., a tester, manipulator or the like). During the testing, the semiconductor device has to be under specific conditions, such as a predetermined temperature, pressure, or humidity, or in a gas-filled environment. Conventionally, the semiconductor device is heated or cooled prior to the testing, and then the testing on the semiconductor device begins after the heating or cooling has been performed for a certain period of time. However, the duration of the heating or cooling is estimated by an operator based on experience. Further, it may be difficult to maintain the semiconductor device in the specific conditions during the testing. Therefore, accuracy of the testing of the semiconductor device may be decreased.

Accordingly, there is a continuous need to improve a configuration of an apparatus for testing the semiconductor device and a method of testing the semiconductor device. It is desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides an apparatus for testing a semiconductor device. The semiconductor device includes a tester; an interface board disposed over the tester and configured to receive the semiconductor device and connect the semiconductor device to the tester; a shield disposed over the interface board and including a recess; a gas-supplying unit including a conduit extending through the shield and accessible to the recess; a temperature-sensing device disposed within the recess; and a controller configured to control and communicate with the tester, the gas-supplying unit and the temperature-sensing device.

In some embodiments, the temperature-sensing device is attached to an interior sidewall of the shield.

In some embodiments, the semiconductor device is disposed on the interface board, and the conduit is disposed above the semiconductor device.

In some embodiments, a gas is flowable from the gas-supplying unit to the recess through the conduit.

In some embodiments, the gas is dry clean air at a predetermined temperature.

In some embodiments, the predetermined temperature is between about −50° C. and about 120° C.

In some embodiments, the temperature-sensing device is a thermocouple, a temperature sensor, a thermistor or a resistive temperature detector.

Another aspect of the present disclosure provides a method of testing a semiconductor device. The method includes steps of providing a tester, an interface board on the tester, a shield over the interface board, a gas-supplying unit, a temperature-sensing device, and a controller communicable with the tester, the gas-supplying unit and the temperature-sensing device; disposing the semiconductor device on the interface board; disposing the shield over the semiconductor device to define a chamber; supplying a gas from the gas-supplying unit to the chamber; measuring a first temperature of the chamber by the temperature-sensing device; and transmitting the measurement of the first temperature from the temperature-sensing device to the controller.

In some embodiments, the method further includes testing the semiconductor device by the tester when the first temperature is substantially equal to a predetermined temperature or is within a predetermined range of temperatures.

In some embodiments, the supplying of the gas and the testing of the semiconductor device are performed simultaneously.

In some embodiments, the predetermined temperature is about −10° C. or 95° C.

In some embodiments, the predetermined range of temperatures is between −12° C. and −8° C. or between 93° C. and 98° C.

In some embodiments, the method further includes moving the shield away from the semiconductor device after the testing of the semiconductor device.

In some embodiments, the method further includes adjusting a temperature or a flow rate of the gas from the gas-supplying unit when the first temperature is substantially greater than or less than a predetermined temperature or is outside of a predetermined range of temperatures.

In some embodiments, the method further includes measuring a second temperature of the chamber by the temperature-sensing device; and transmitting the measurement of the second temperature from the temperature-sensing device to the controller.

In some embodiments, the method further includes testing the semiconductor device by the tester when the second temperature is substantially equal to a predetermined temperature or is within a predetermined range of temperatures.

In some embodiments, the method further includes adjusting a temperature or a flow rate of the gas from the gas-supplying unit when the second temperature is substantially greater than or less than a predetermined temperature or is outside of a predetermined range of temperatures.

In some embodiments, the supplying of the gas and the testing of the semiconductor device are performed simultaneously.

In some embodiments, the disposing of the shield includes moving the shield toward the semiconductor device until the shield touches the load board or the tester.

In some embodiments, the method further includes obtaining an internal temperature of the semiconductor device from the interface board or the tester; and transmitting the internal temperature of the semiconductor device from the tester to the controller.

In conclusion, a temperature-sensing device is included in an apparatus for testing a semiconductor device, and a temperature measured by the temperature-sensing device can be provided to a controller to ensure that the semiconductor device is at a predetermined temperature before the beginning of the testing. As such, the semiconductor device is tested at the predetermined temperature. Therefore, accuracy of the testing result can be increased or improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
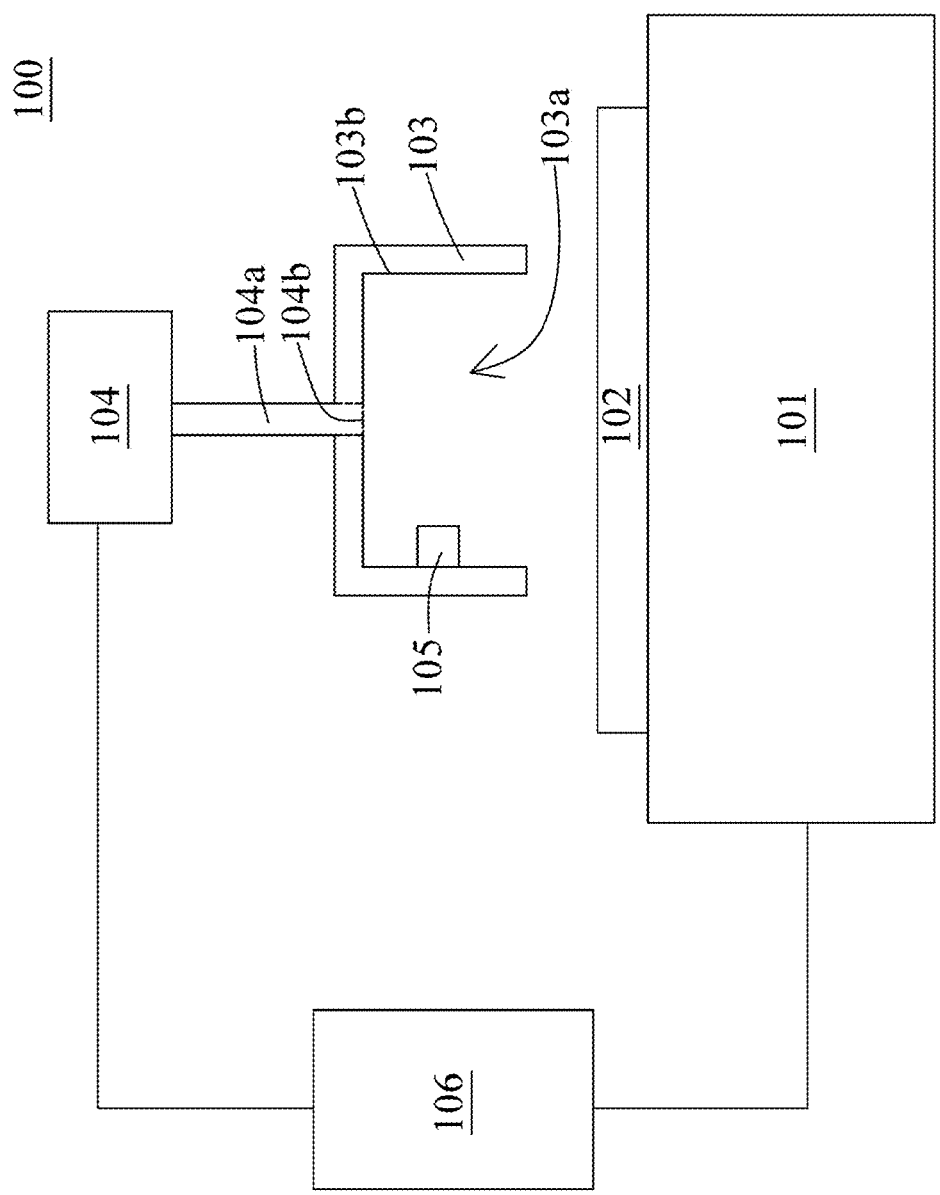
FIG. 1 is a cross-sectional view of a first apparatus in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a first apparatus 100 in accordance with some embodiments of the present disclosure. In some embodiments, the first apparatus 100 is configured to perform electrical testing on a semiconductor device. In some embodiments, the semiconductor device is under a specific condition during the electrical testing. In some embodiments, the first apparatus 100 includes a tester 101, an interface board 102 on the tester 101, a shield 103 above the interface board 102, a gas-supplying unit 104, a temperature-sensing device 105 and a controller 106.

In some embodiments, the tester 101 is configured to transmit a signal to and receive a signal from the semiconductor device. In some embodiments, the tester 101 provides an electrical signal to the semiconductor device, and the semiconductor device then transmits a feedback signal to the tester 101 based on the electrical signal from the tester 101. In some embodiments, the tester 101 is a manipulator, a memory tester, a test head, automatic test equipment (ATE) or the like. In some embodiments, the tester 101 serves as a base of the first apparatus 100.

In some embodiments, the interface board 102 is disposed above the tester 101. In some embodiments, the interface board 102 is electrically connected to the tester 101 and the semiconductor device. In some embodiments, the interface board 102 is disposed between the tester 101 and the semiconductor device. In some embodiments, the semiconductor device can be attached to and detached from the interface board 102. In some embodiments, the interface board 102 is configured to receive the semiconductor device and connect the semiconductor device to the tester 101.

In some embodiments, the interface board 102 is a circuit board including several circuitries and several electrical components thereon. In some embodiments, the interface board 102 is a printed circuit board (PCB) having a test circuit with test sockets and electrical components (e.g., chips, resistors, capacitors, inductors, relays, connectors or the like). In some embodiments, the interface board 102 is made of ceramic, fiberglass or the like. In some embodiments, the interface board 102 includes a number of circuit layers, depending on complexity of design.

In some embodiments, the interface board 102 is configured to transmit a signal from the tester 101 to the semiconductor device and to transmit a feedback signal from the semiconductor device to the tester 101. In some embodiments, the interface board 102 is a load board, a device under test (DUT) board, a probe card or the like.

In some embodiments, the shield 103 is disposed above the interface board 102 and the tester 101. In some embodiments, the shield 103 is configured to be placed over the interface board 102 and around the semiconductor device during testing. In some embodiments, the shield 103 can be moved toward and away from the interface board 102. In some embodiments, the shield 103 is configured to isolate the semiconductor device from the surrounding environment during testing, such that the semiconductor device can be maintained in a specific condition (e.g., at a predetermined temperature or pressure) during testing. In some embodiments, the shield 103 serves as a thermal mask.

In some embodiments, the shield 103 includes a recess 103a defined by interior sidewalls 103b of the shield 103. In some embodiments, the recess 103a is indented into the shield 103. In some embodiments, the semiconductor device is disposed within the recess 103a when the shield 103 is placed on the interface board 102. In some embodiments, the shield 103 is made of metallic material such as copper, steel or the like. In some embodiments, a cross section of the shield 103 has a circular, quadrilateral or polygonal shape.

In some embodiments, the gas-supplying unit 104 is configured to supply a gas or fluid to the recess 103a of the shield 103. In some embodiments, the gas-supplying unit 104 includes a conduit 104a extending through the shield 103 and accessible to the recess 103a of the shield 103. In some embodiments, the conduit 103a is disposed above the semiconductor device.

In some embodiments, the gas-supplying unit 104 includes a source for supplying the gas through the conduit 104a. In some embodiments, the source is coupled to the conduit 104a. In some embodiments, the conduit 104a extends between the source and the shield 103.

In some embodiments, the gas can flow from the gas-supplying unit 104 to the recess 103a through the conduit 104a. In some embodiments, the gas is blown from the source toward the opening 104b through the conduit 104a to adjust a temperature inside the recess 103a. In some embodiments, the gas can be discharged from an opening 104b of the conduit 104a.

In some embodiments, the opening 104b can be disposed at any position of the interior sidewall 103b of the shield 103, as long as the opening 104b is coupled to the conduit 104a and the gas can be discharged from the opening 104b and can flow into the recess 103a. In some embodiments, the opening 104b is located at a position of the interior sidewall 103b above the semiconductor device.

In some embodiments, the gas can be air, dry clean air (DCA), inert gas, hydrogen, carbon dioxide or the like. In some embodiments, the gas supplied from the source is at a predetermined temperature. For example, the gas can be hot air (e.g., at a temperature above 90° C.) or cool air (e.g., at a temperature below −5° C.). In some embodiments, the predetermined temperature is between about −50° C. and about 120° C. In some embodiments, the predetermined temperature is between about −10° C. and about 95° C.

In some embodiments, the temperature-sensing device 105 is disposed within the recess 103a and surrounded by the shield 103. In some embodiments, the temperature-sensing device 105 is configured to sense or measure a temperature of the recess 103a and provide the measurement of the temperature to the gas-supplying unit 104 or another suitable unit. In some embodiments, the temperature-sensing device 105 is electrically connected to the gas-supplying unit 104.

In some embodiments, the temperature-sensing device 105 is disposed away from the opening 104b of the gas-supplying unit 104. In some embodiments, the temperature-sensing device 105 is attached to any position of the interior sidewall 103b of the shield 103. In some embodiments, the temperature-sensing device 105 is a thermocouple, a temperature sensor, a thermistor or a resistive temperature detector.

In some embodiments, the controller 106 is configured to control and communicate with the tester 101, the gas-supplying unit 104 and the temperature-sensing device 105. In some embodiments, the controller 106 is electrically connected to the tester 101, the gas-supplying unit 104 and the temperature-sensing device 105, such that a feedback signal can be transmitted from the tester 101, the gas-supplying unit 104 or the temperature-sensing device 105 to the controller 106.

In some embodiments, the controller 106 can adjust an overall operation of the first apparatus 100 based on the feedback signal from the tester 101, the gas-supplying unit 104 or the temperature-sensing device 105. In some embodiments, a signal indicating a temperature of the gas supplied from the gas-supplying unit 104 is transmitted to the controller 106. In some embodiments, a signal indicating a temperature of the recess 103a measured by the temperature-sensing device 105 is transmitted from the gas-supplying unit 104 to the controller 106.

In some embodiments, a signal indicating the temperature of the recess 103a measured by the temperature-sensing device 105 is transmitted from the temperature-sensing device 105 to the controller 106. In some embodiments, a signal indicating a temperature of the semiconductor device disposed on the interface board 102 is transmitted from the tester 101 to the controller 106.

In some embodiments, the controller 106 may transmit a signal to the gas-supplying unit 104 for requesting a feedback signal indicating the temperature of the gas supplied from the gas-supplying unit 104 or the temperature of the recess 103a measured by the temperature-sensing device 105. In some embodiments, the controller 106 may transmit a signal to the temperature-sensing device 105 for requesting a feedback signal indicating the temperature of the recess 103a measured by the temperature-sensing device 105.

In some embodiments, the controller 106 may transmit a signal to the tester 101 for requesting a feedback signal indicating the temperature of the semiconductor device from the tester 101. In some embodiments, the controller 106 may transmit a signal to the gas-supplying unit 104 based on the feedback signal from the tester 101, the gas-supplying unit 104 or the temperature-sensing device 105 to adjust the temperature of the gas supplied from the gas-supplying unit 104 or duration of supplying of the gas from the gas-supplying unit 104 to the recess 103a.

The temperature of the gas supplied from the gas-supplying unit 104 or the duration of supplying of the gas from the gas-supplying unit 104 to the recess 103a is adjustable in real time according to the feedback signal from the tester 101, the gas-supplying unit 104 or the temperature-sensing device 105, and the adjustment of the temperature or duration can be performed automatically. As such, a predetermined condition can be accurately provided for the semiconductor device during testing. As a result, accuracy of testing results can be increased or improved.

Figure 2:
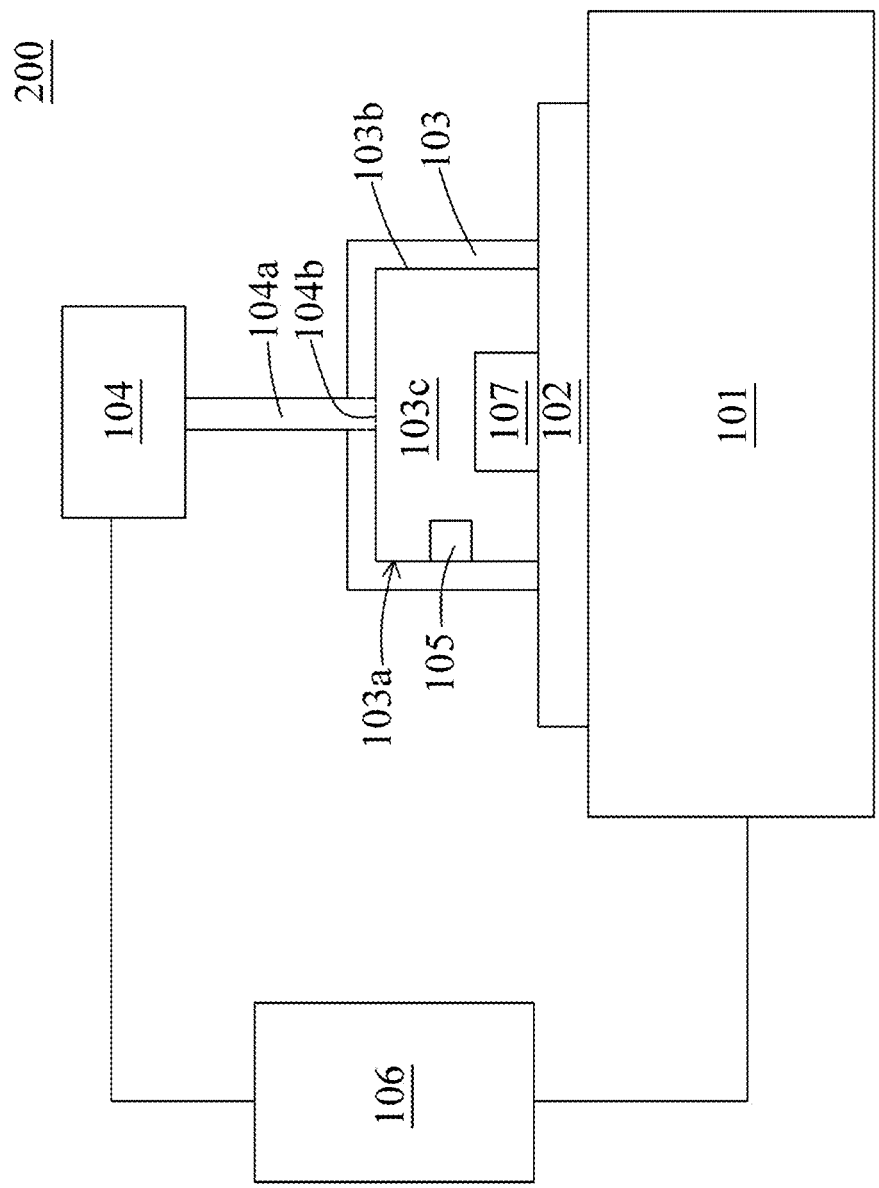
FIG. 2 is a cross-sectional view of a second apparatus in accordance with some embodiments of the present disclosure.

FIG. 2 is a schematic cross-sectional view of a second apparatus 200 in accordance with some embodiments of the present disclosure. In some embodiments, the second apparatus 200 has a configuration similar to that of the first apparatus 100, except that the semiconductor device 107 is placed on the interface board 102 and a chamber 103c is formed.

In some embodiments, the semiconductor device 107 is a semiconductor structure or a part of the semiconductor structure. In some embodiments, the semiconductor device 107 includes circuitry or components formed thereover. In some embodiments, the semiconductor device 107 is a wafer, a chip or a package. In some embodiments, the semiconductor device 107 is a memory package such as a DRAM package.

In some embodiments, the semiconductor device 107 is communicable with the tester 101 through the interface board 102. In some embodiments, a testing signal can be transmitted from the tester 101 to the semiconductor device 107 through the interface board 102, and then a feedback signal based on the testing signal received can be transmitted from the semiconductor device 107 to the tester 101 through the interface board 102.

In some embodiments, the shield 103 is placed on the interface board 102 and surrounds the semiconductor device 107 to form the chamber 103c. In some embodiments, the chamber 103c is defined by the interior sidewalls 103b of the shield 103 and a surface of the interface board 102. In some embodiments, the semiconductor device 107 and the temperature-sensing device 105 are disposed within the chamber 103c.

In some embodiments, a temperature of the chamber 103c can be measured by the temperature-sensing device 105. In some embodiments, the chamber 103c is accessible through the conduit 104a and the opening 104b, so that the gas can flow from the gas-supplying unit 104 to the chamber 103c through the conduit 104a and the opening 104b. In some embodiments, the gas is supplied to fill the chamber 103c.

In some embodiments, the semiconductor device 107 is disposed within the chamber 103c, so that the semiconductor device 107 can be maintained in a predetermined condition provided by the chamber 103c. For example, a hot air at a predetermined temperature is supplied from the gas-supplying unit 104 to the chamber 103c, and therefore the semiconductor device 107 disposed within the chamber 103c can be maintained at the predetermined temperature or at a temperature substantially equal to the predetermined temperature.

In some embodiments, a width of the recess 103a of the shield 103 is substantially less than a width of the interface board 102. In some embodiments, the width of the recess 103a is substantially greater than a width of the semiconductor device 107.

Figure 3:
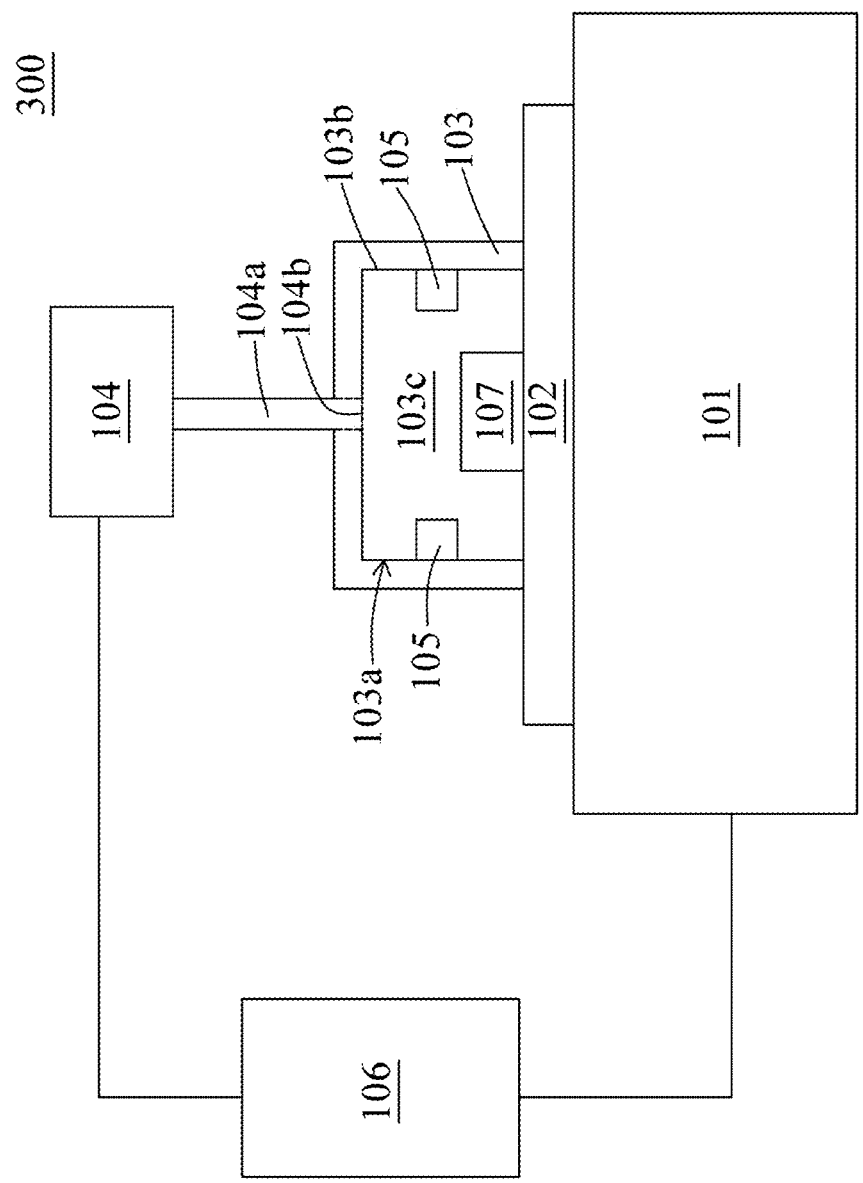
FIG. 3 is a cross-sectional view of a third apparatus in accordance with some embodiments of the present disclosure.

FIG. 3 is a schematic cross-sectional view of a third apparatus 300 in accordance with some embodiments of the present disclosure. In some embodiments, the third apparatus 300 has a configuration similar to that of the second apparatus 200, except that more than one temperature-sensing device 105 is disposed within the chamber 103c.

In some embodiments, two temperature-sensing devices 105 are disposed on the interior sidewalls of the shield 103, respectively. In some embodiments, the two temperature-sensing devices 105 are disposed opposite to each other. In some embodiments, the semiconductor device 107 is disposed between the two temperature-sensing devices 105.

Figure 4:
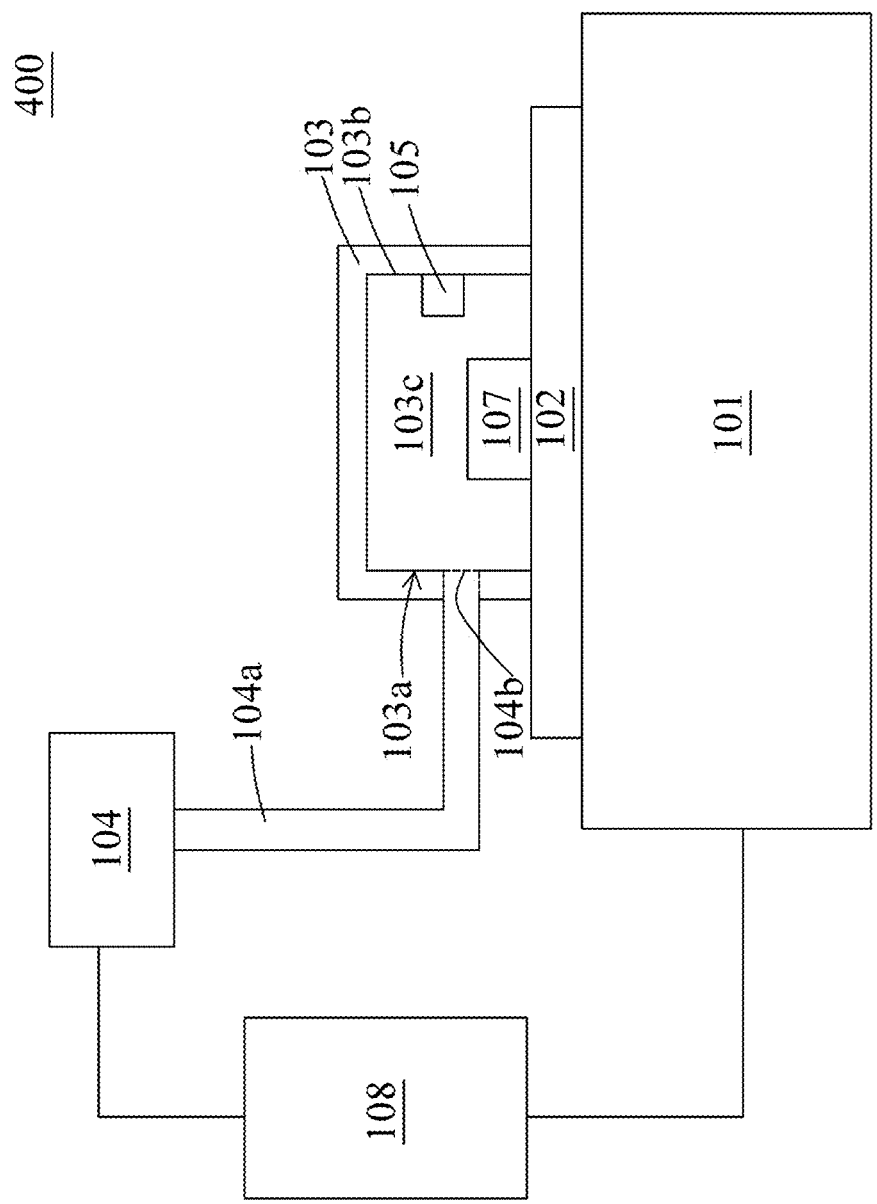
FIG. 4 is a cross-sectional view of a fourth apparatus in accordance with some embodiments of the present disclosure.

FIG. 4 is a schematic cross-sectional view of a fourth apparatus 400 in accordance with some embodiments of the present disclosure. In some embodiments, the fourth apparatus 400 has a configuration similar to that of the second apparatus 200, except that the conduit 104a and the opening 104b are disposed at a side of the semiconductor device 107 (rather than above the semiconductor device 107 as illustrated in FIG. 2).

In some embodiments, the conduit 104a extends from a sidewall of the shield 103, and the opening 103b is disposed at a side of the semiconductor device 107. In some embodiments, the gas flows out from the opening 104b horizontally. In some embodiments, the opening 104b is disposed opposite to the temperature-sensing device 105.

Figure 5:
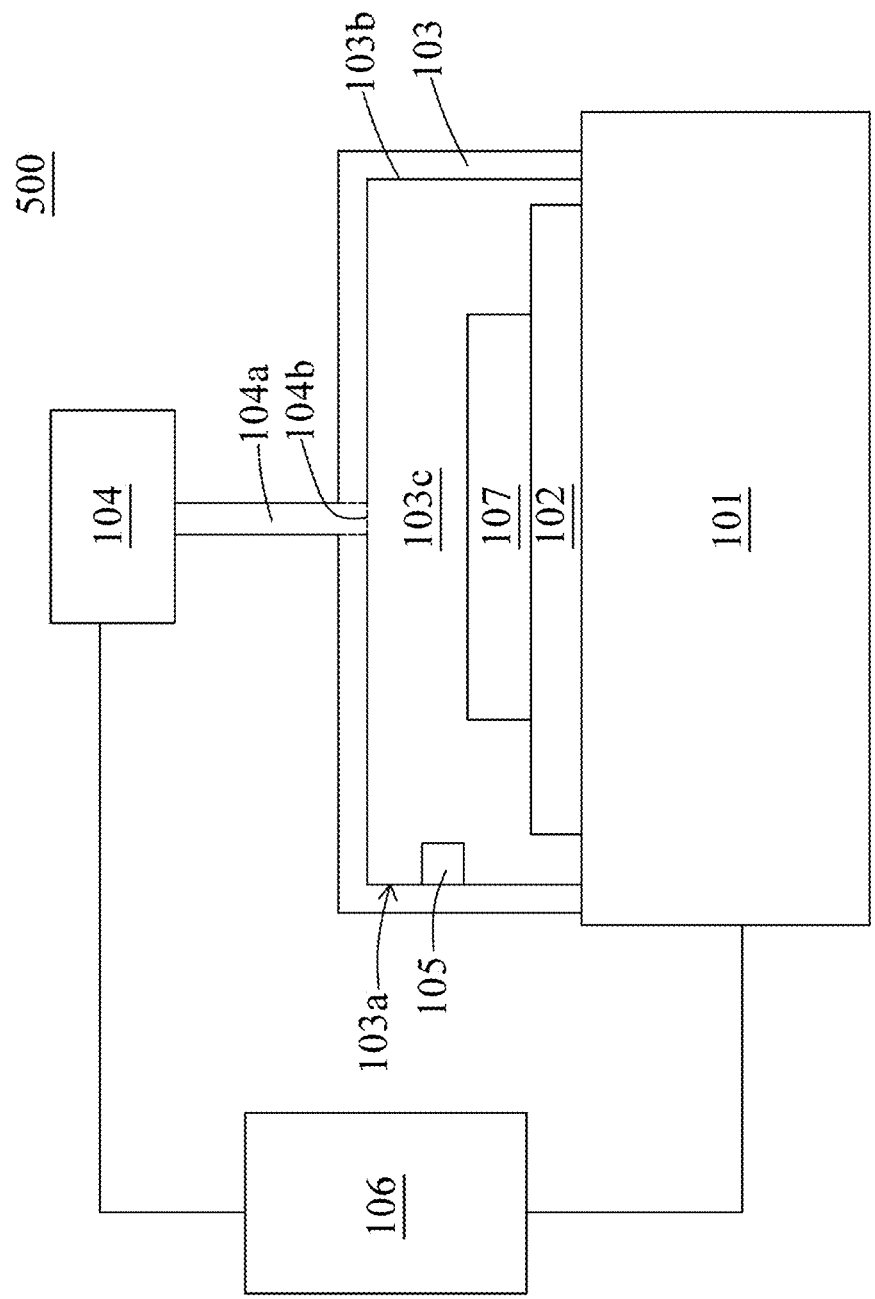
FIG. 5 is a cross-sectional view of a fifth apparatus in accordance with some embodiments of the present disclosure.

FIG. 5 is a schematic cross-sectional view of a fifth apparatus 500 in accordance with some embodiments of the present disclosure. In some embodiments, the fifth apparatus 500 has a configuration similar to that of the first apparatus 100, except that the shield 103 is placed on the tester 101, and the semiconductor device 107 and the interface board 102 are disposed within the chamber 103c.

In some embodiments, a width of the recess 103a is substantially greater than a width of the semiconductor device 107 and a width of the interface board 102. In some embodiments, the width of the recess 103a is substantially less than a width of the tester 101. In some embodiments, the semiconductor device 107 and the interface board 102 are disposed within the chamber 103c, so that the semiconductor device 107 and the interface board 102 can be maintained in a predetermined condition provided by the chamber 103c.

Figure 6:
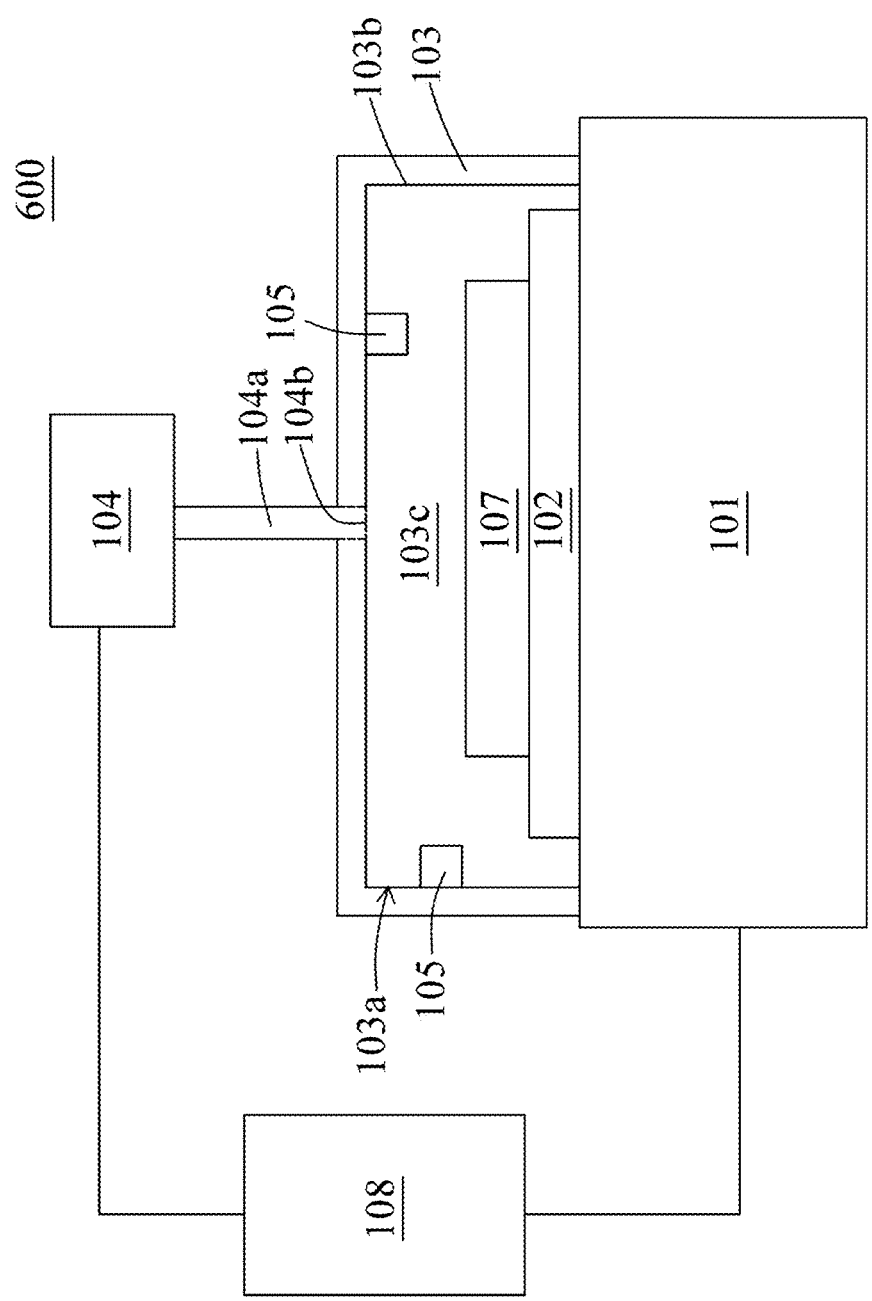
FIG. 6 is a cross-sectional view of a sixth apparatus in accordance with some embodiments of the present disclosure.

FIG. 6 is a schematic cross-sectional view of a sixth apparatus 600 in accordance with some embodiments of the present disclosure. In some embodiments, the sixth apparatus 600 has a configuration similar to that of the fifth apparatus 500, except that more than one temperature-sensing device 105 is disposed within the chamber 103c.

In some embodiments, two temperature-sensing devices 105 are disposed on the interior sidewalls of the shield 103, respectively. In some embodiments, the two temperature-sensing devices 105 are disposed opposite to each other. In some embodiments, the semiconductor device 107 is disposed between the two temperature-sensing devices 105. In some embodiments, one of the temperature-sensing devices 105 is disposed at a side of the semiconductor device 107, and the other one is disposed above the semiconductor device 107.

Figure 7:
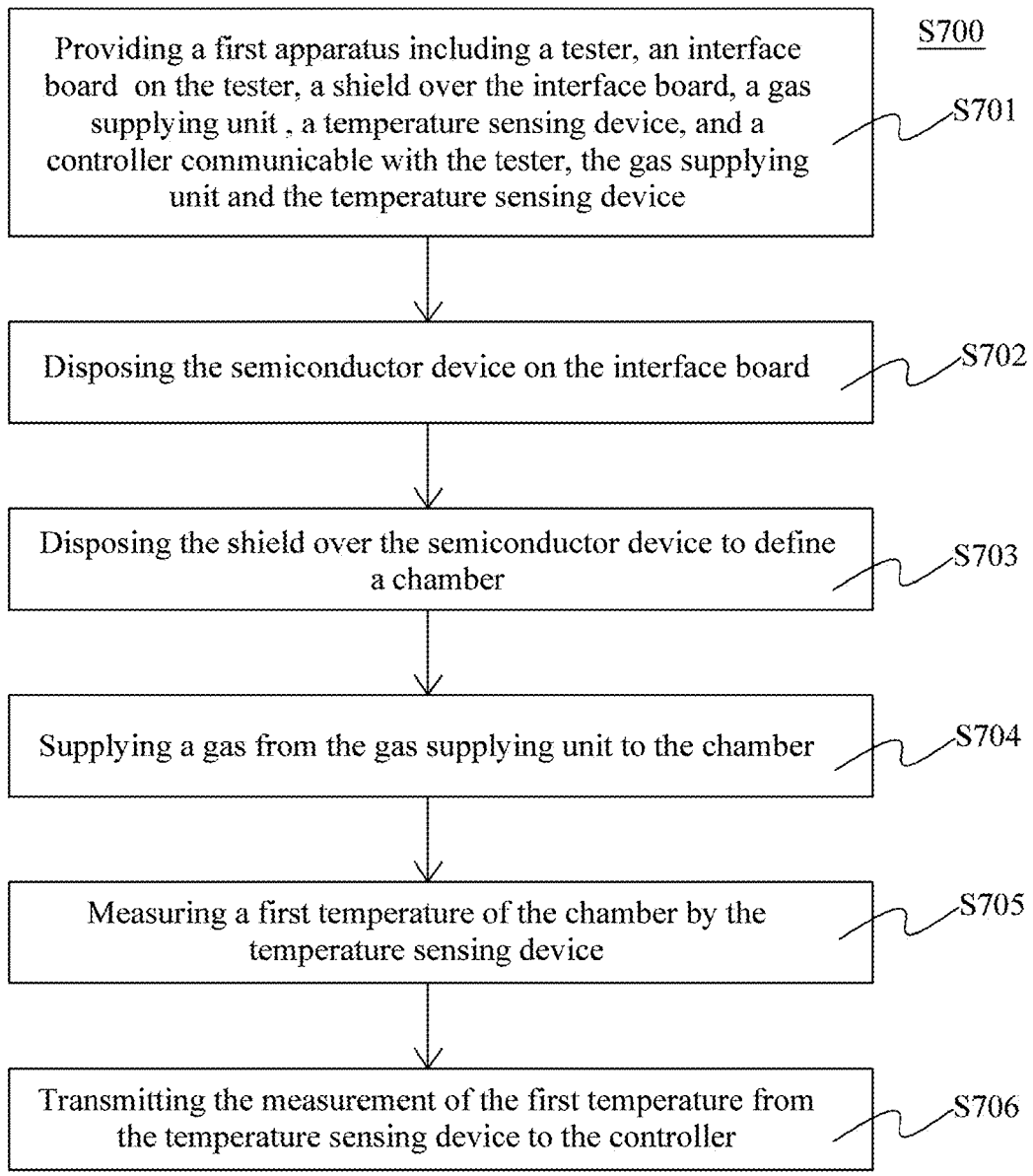
FIG. 7 is a flow diagram illustrating a method of testing a semiconductor device in accordance with some embodiments of the present disclosure.

FIG. 7 is a flow diagram illustrating a method S700 of testing a semiconductor device in accordance with some embodiments of the present disclosure, and FIGS. 8 through 21 illustrate cross-sectional views of intermediate stages in the testing of the semiconductor device in accordance with some embodiments of the present disclosure.

The stages shown in FIGS. 8 to 21 are also illustrated schematically in the flow diagram in FIG. 7. In the following discussion, the testing stages shown in FIGS. 8 to 21 are discussed in reference to the process steps shown in FIG. 7. The method S700 includes a number of operations and the description and illustration are not deemed as a limitation as the sequence of the operations. The method S700 includes a number of steps (S701, S702, S703, S704, S705 and S706).

Figure 8:
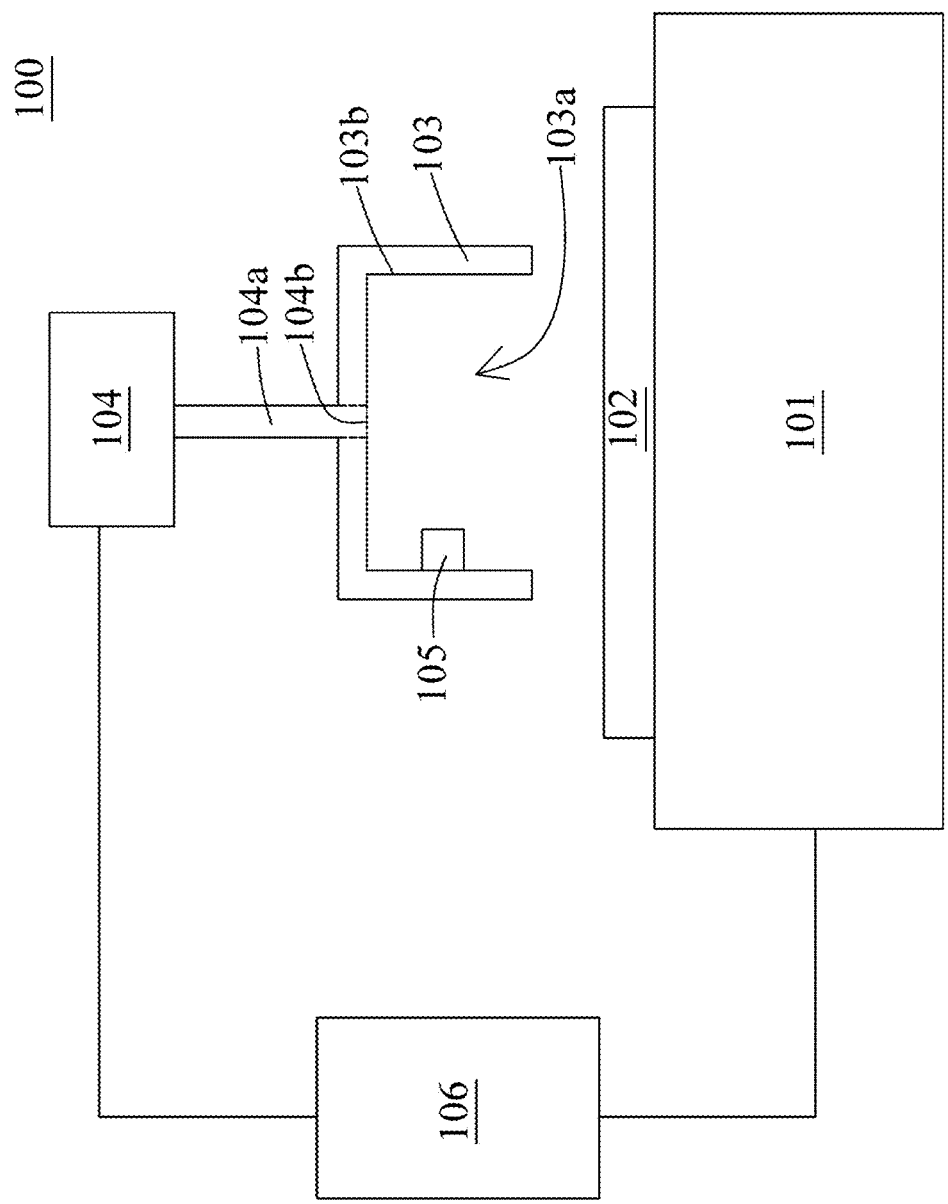
FIGS. 8 through 21 illustrate cross-sectional views of intermediate stages in the testing of a semiconductor device in accordance with some embodiments of the present disclosure.

Referring to FIG. 8, a first apparatus 100 is provided according to a step S701 in FIG. 7. In some embodiments, the first apparatus 100 is configured to perform electrical testing on a semiconductor device. In some embodiments, the semiconductor device is under a specific condition during the electrical testing. In some embodiments, the provision of the first apparatus 100 includes providing a tester 101, an interface board 102 on the tester, a shield 103 over the interface board, a gas-supplying unit 104, a temperature-sensing device 105 and a controller 106 that can communicate with the tester 101, the gas-supplying unit 104 and the temperature-sensing device 105.

In some embodiments, the tester 101 provides an electrical signal to the semiconductor device, and the semiconductor device then transmits a feedback signal to the tester 101 based on the electrical signal from the tester 101. In some embodiments, the tester 101 is a manipulator, a memory tester, a test head, automatic test equipment (ATE) or the like.

In some embodiments, the interface board 102 is provided above the tester 101. In some embodiments, the interface board 102 is configured to receive the semiconductor device and connect the semiconductor device to the tester 101. In some embodiments, the interface board 102 is a circuit board including several circuitries and several electrical components thereon. In some embodiments, the interface board 102 is configured to transmit a signal from the tester 101 to the semiconductor device and to transmit a feedback signal from the semiconductor device to the tester 101.

In some embodiments, the shield 103 is disposed above the interface board 102 and the tester 101. In some embodiments, the shield 103 is configured to be placed over the interface board 102 and around the semiconductor device during testing. In some embodiments, the shield 103 is movable toward and away from the interface board 102. In some embodiments, the shield 103 is configured to isolate the semiconductor device from the surrounding environment during testing, such that the semiconductor device can be maintained in a specific condition (e.g., at a predetermined temperature or pressure) during testing. In some embodiments, prior to the placement of the semiconductor device, the shield 103 is in an open configuration as shown in FIG. 8, such that the recess 103a is accessible.

In some embodiments, the gas-supplying unit 104 is configured to supply a gas or fluid to the recess 103a of the shield 103. In some embodiments, the gas-supplying unit 104 includes a conduit 104a extending through the shield 103 and accessible to the recess 103a of the shield 103. In some embodiments, prior to the placement of the semiconductor device, the gas-supplying unit 104 is turned off. No gas or fluid is discharged from the gas-supplying unit 104. In some embodiments, the gas-supplying unit 104 is turned off when the shield 103 is in the open configuration.

In some embodiments, the temperature-sensing device 105 is disposed within the recess 103a and surrounded by the shield 103. In some embodiments, the temperature-sensing device 105 is configured to sense or measure a temperature of the recess 103a and provide the measurement of the temperature to the gas-supplying unit 104 or another suitable unit. In some embodiments, the temperature-sensing device 105 is attached to any position of the interior sidewall 103b of the shield 103.

In some embodiments, the controller 106 is configured to control and communicate with the tester 101, the gas-supplying unit 104 and the temperature-sensing device 105. In some embodiments, the controller 106 can adjust an overall operation of the first apparatus 100 based on the feedback signal from the tester 101, the gas-supplying unit 104 or the temperature-sensing device 105. In some embodiments, the first apparatus 100 has a configuration similar to the one described above or illustrated in any FIGS. 1 to 6.

Figure 9:
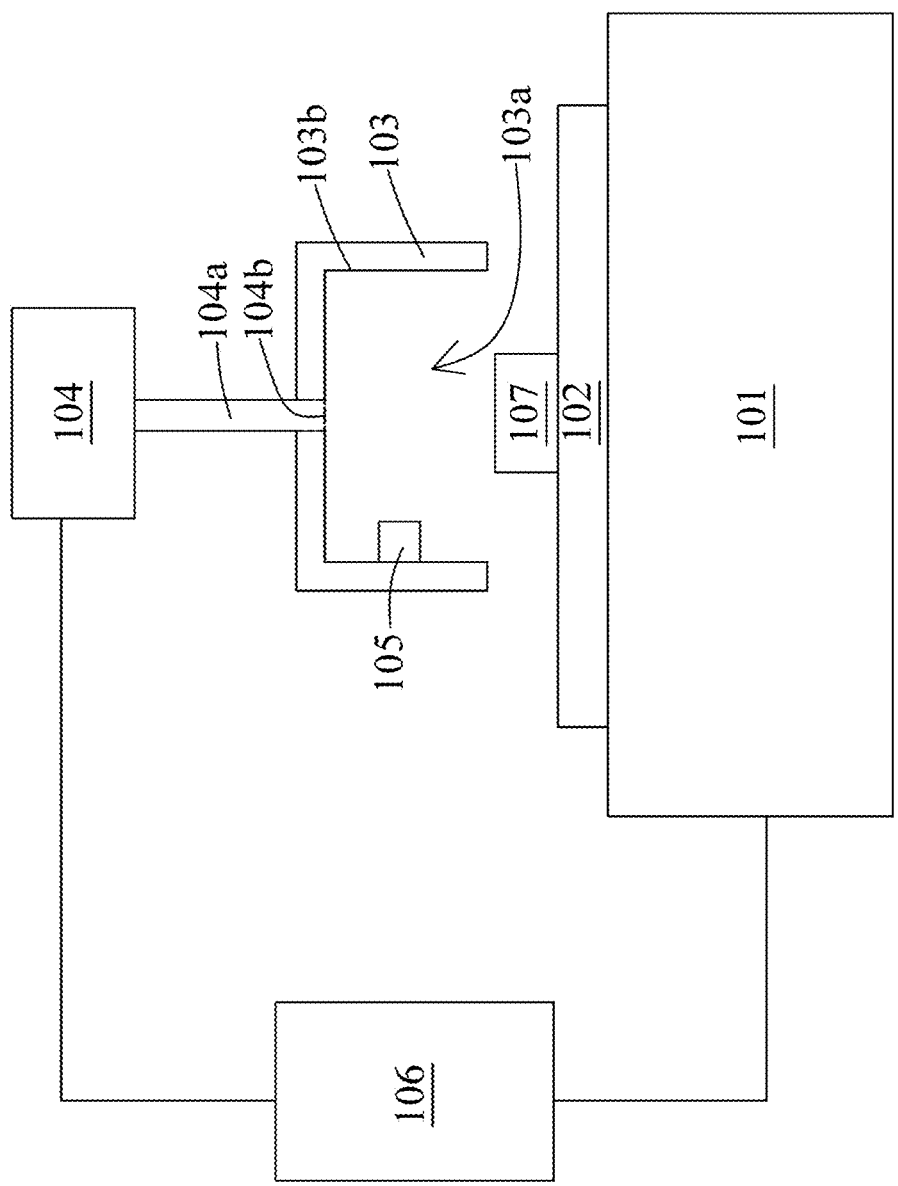

Referring to FIG. 9, the semiconductor device 107 is disposed on the interface board 102 according to a step S702 in FIG. 7. In some embodiments, the semiconductor device 107 is placed on and electrically connected to the interface board 102. In some embodiments, the disposing of the semiconductor device 107 is performed when the shield 103 is in the open configuration. In some embodiments, the semiconductor device 107 is a wafer, a chip, a package or the like. In some embodiments, the semiconductor device 107 has a configuration similar to the one described above or illustrated in any FIGS. 1 to 6.

Figure 10:
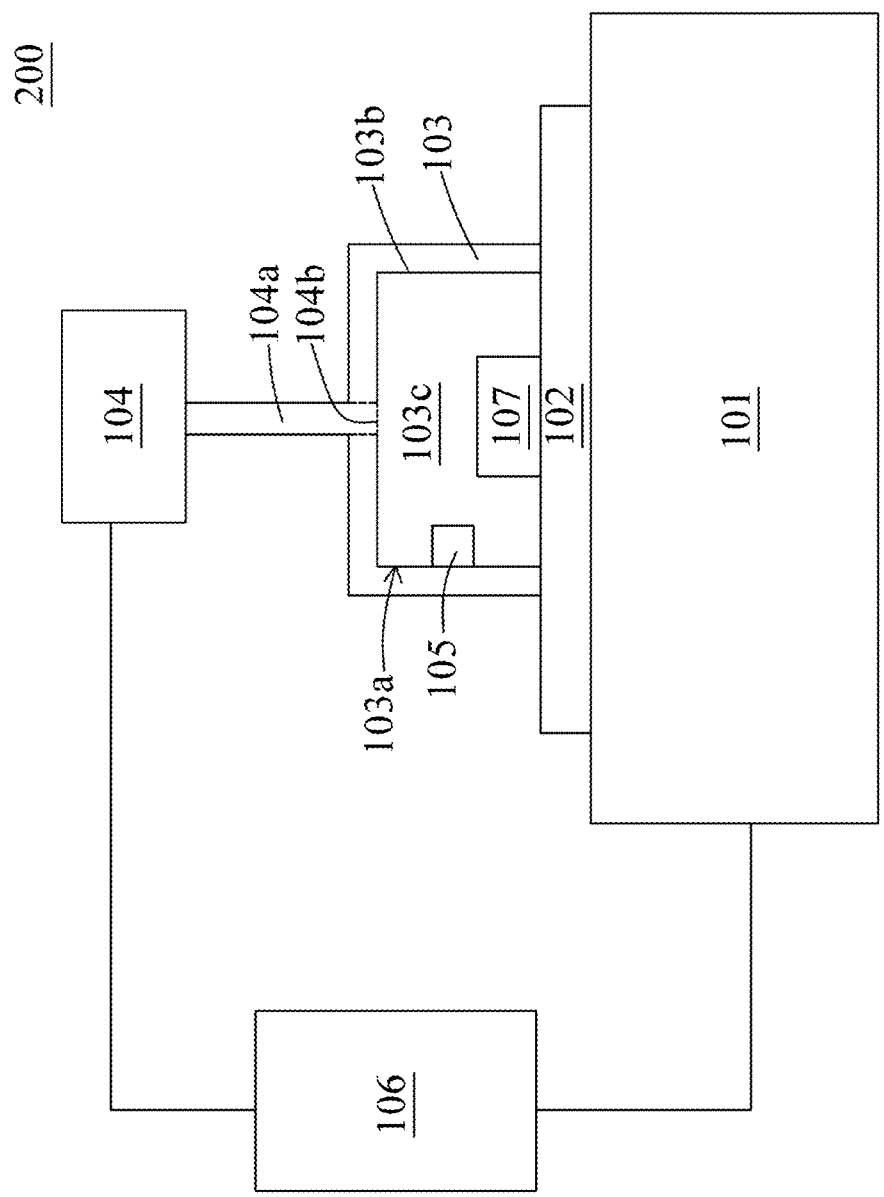

Referring to FIG. 10, the shield 103 is disposed over the semiconductor device 107 to define a chamber 103c according to a step S703 in FIG. 7. In some embodiments, the disposing of the shield 103 includes moving the shield 103 toward the interface board 102 until the shield 103 touches the interface board 102. In some embodiments, the semiconductor device 107 is covered by the shield 103 and disposed within the chamber 103c when the shield 103 is in a closed configuration as shown in FIG. 10. In some embodiments, a second apparatus 200 as shown in FIG. 2 is provided.

Figure 11:
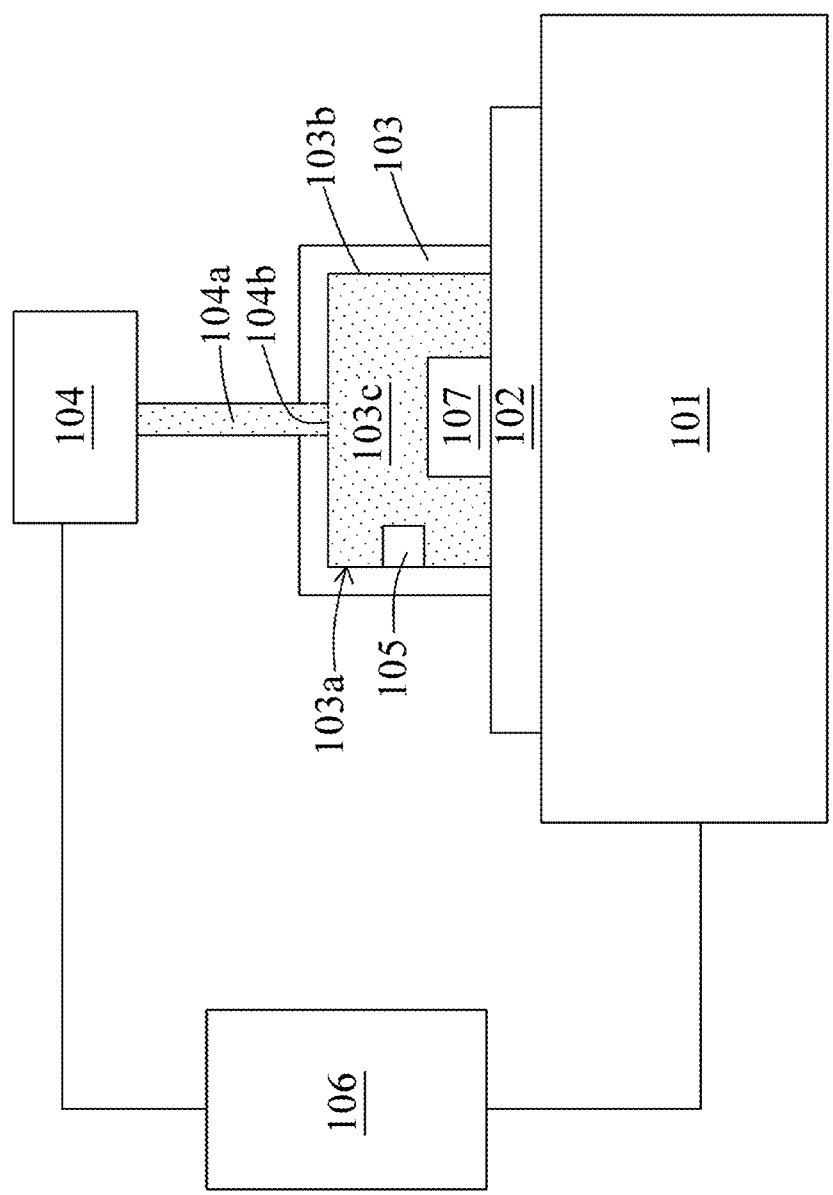

Referring to FIG. 11, a gas is supplied from the gas-supplying unit to the chamber 103c according to a step S704 in FIG. 7. In some embodiments, the gas flows from a source to the chamber 103c through the conduit 104a, so that the gas surrounds the semiconductor device 107. In some embodiments, the gas is supplied when the shield 103 is in the closed configuration. In some embodiments, the gas supplied from the gas-supplying unit is at a predetermined temperature. In some embodiments, the predetermined temperature is between $-12°$ C. and $-8°$ C. or between $93°$ C. and $98°$ C. In some embodiments, the predetermined temperature of the gas is about $-10°$ C. or $95°$ C.

Referring to FIG. 11, a first temperature of the chamber 103c is measured by the temperature-sensing device 105 according to a step S705 in FIG. 7. In some embodiments, the temperature-sensing device 105 measures the first temperature of the chamber 103c during the supplying of the gas from the gas-supplying unit 104. In some embodiments, the temperature-sensing device 105 measures the first temperature of the chamber 103c after the supplying of the gas for a predetermined duration. In some embodiments, the temperature-sensing device 105 continues to measure the first temperature of the chamber 103c until the first temperature reaches the predetermined temperature or until the first temperature is within the predetermined range of temperatures. In some embodiments, the chamber 103c is at the first temperature. In some embodiments, the first temperature of the chamber 103c is recorded for subsequent use.

Figure 12:
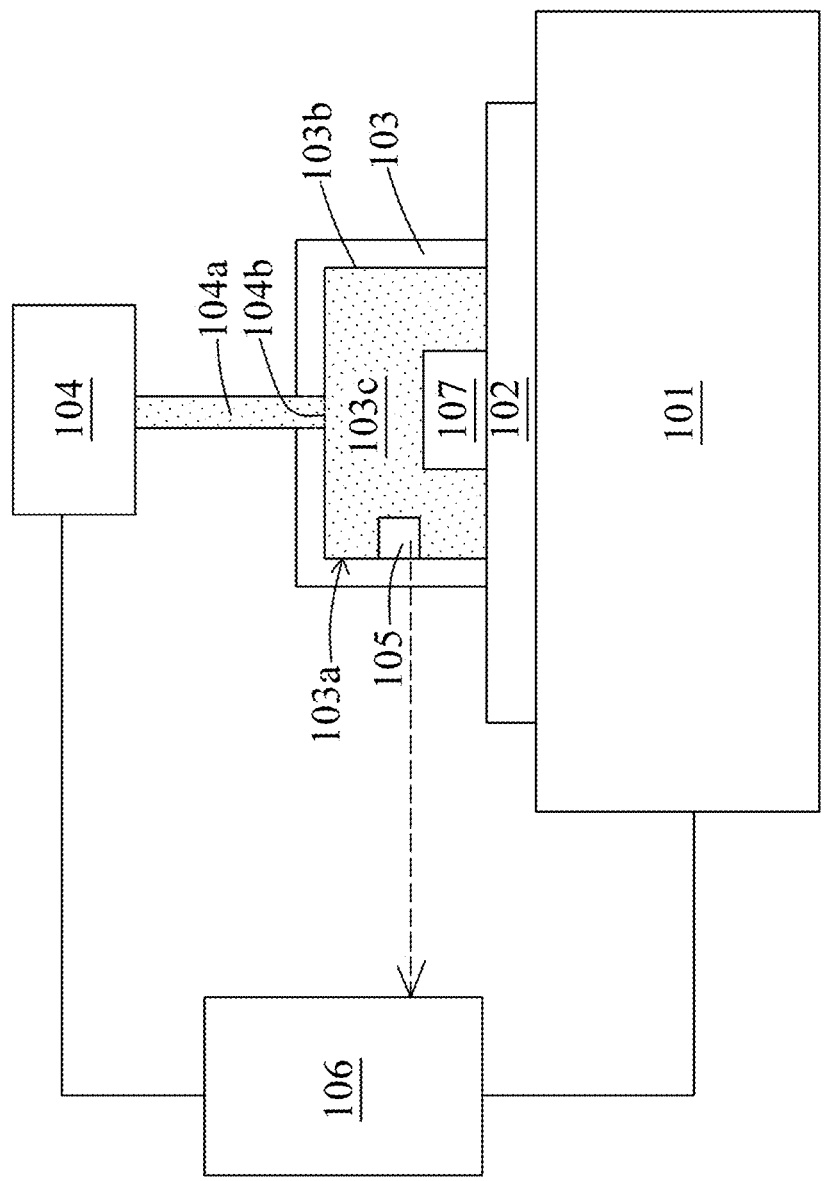

Referring to FIG. 12, the measurement of the first temperature is transmitted from the temperature-sensing device 105 to the controller 106 (indicated by a dashed arrow) according to a step S706 in FIG. 7. In some embodiments, a signal indicating the first temperature is transmitted from the temperature-sensing device 105 to the controller 106. In some embodiments, the first temperature can be transmitted directly to the controller 106 or transmitted to the controller 106 through the gas-supplying unit 104. In some embodiments, the signal indicating the first temperature can be transmitted via wired connection or wirelessly from the temperature-sensing device 105 to the controller 106.

Figure 13:
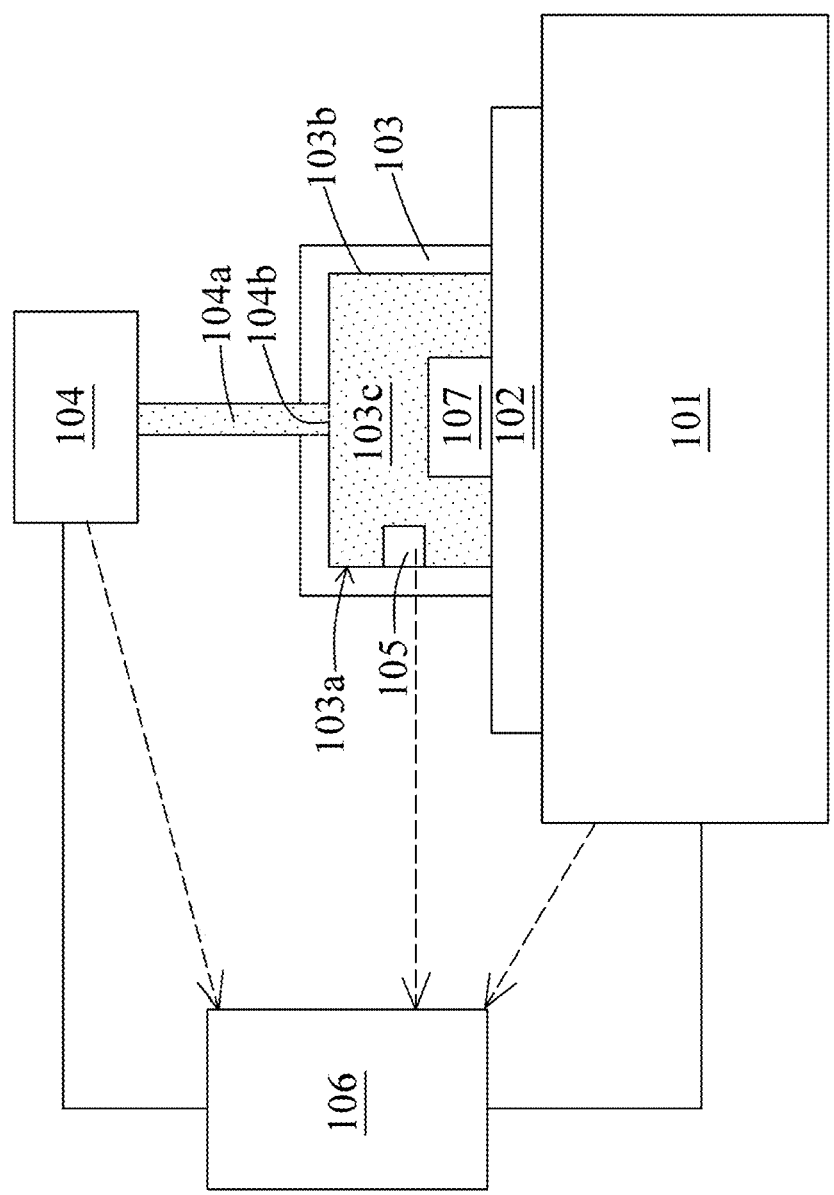

In some embodiments, a temperature of the gas is obtained from the gas-supplying unit 104. In some embodiments, a signal indicating the temperature of the gas supplied from the gas-supplying unit 104 is transmitted from the gas-supplying unit 104 to the controller 106 (indicated by the dashed arrow) as illustrated in FIG. 13. In some embodiments, the transmission of the signal indicating the first temperature and the transmission of the signal indicating the temperature of the gas are performed separately or simultaneously. In some embodiments, the signal indicating the temperature of the gas can be transmitted via wired connection or wirelessly from the gas-supplying unit 104 to the controller 106.

In some embodiments, an internal temperature of the semiconductor device 107 can be obtained from the interface board 102 or the tester 101. In some embodiments, a signal indicating the internal temperature of the semiconductor device 107 is transmitted from the tester 101 to the controller 106 (indicated by the dashed arrow) as illustrated in FIG. 13. In some embodiments, the signal indicating the internal temperature of the semiconductor device 107 can be transmitted via wired connection or wirelessly from the tester 101 to the controller 106.

Figure 14:
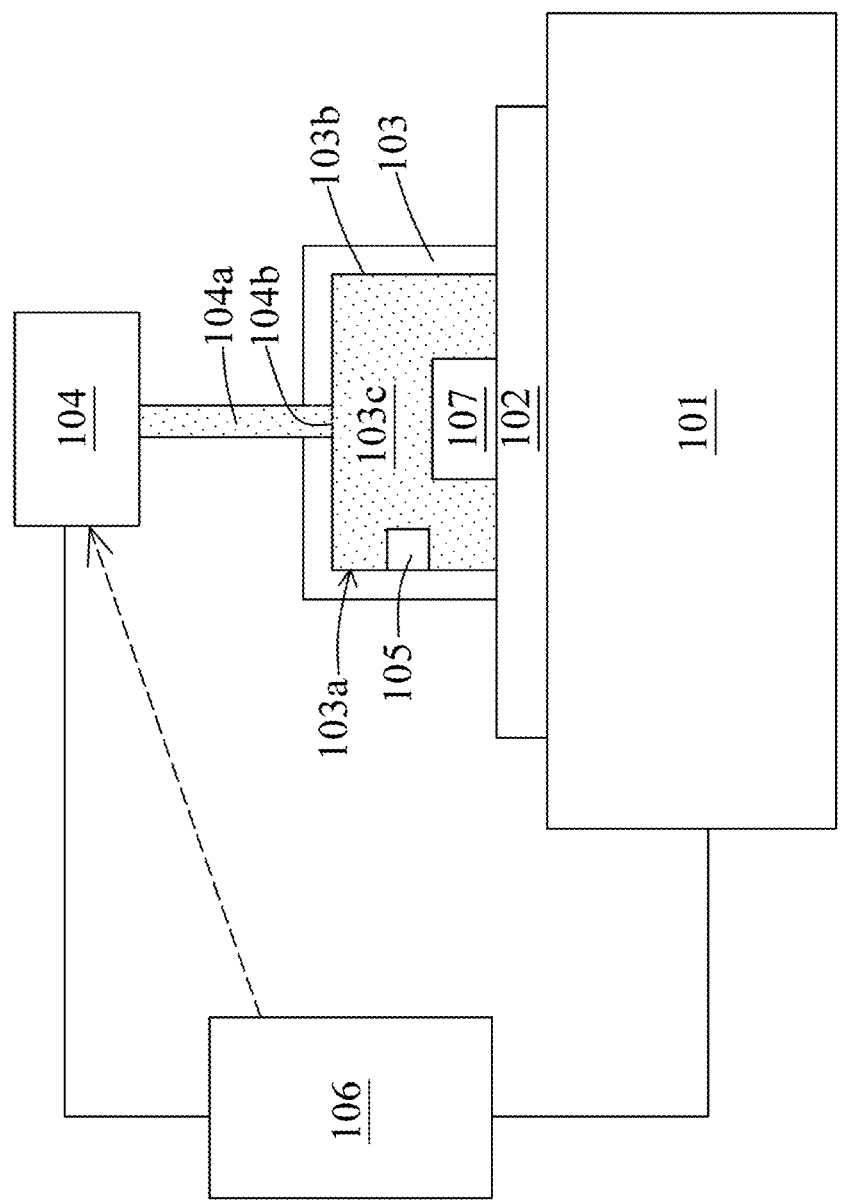

In some embodiments, a feedback signal is transmitted from the controller 106 to the gas-supplying unit 104 (indicated by the dashed arrow) as illustrated in FIG. 14. In some embodiments, the feedback signal is transmitted from the controller 106 to the gas-supplying unit 104 after receiving the signal indicating the first temperature, the signal indicating the temperature of the gas or the signal indicating the internal temperature of the semiconductor device 107.

In some embodiments, when the first temperature is substantially equal to a predetermined temperature or is within a predetermined range of temperatures, the feedback signal is transmitted to the gas-supplying unit 104 to instruct the gas-supplying unit 104 to continue the discharge of the gas at the first temperature from the gas-supplying unit 104 to the chamber 103c or to cease the discharge of the gas from the gas-supplying unit 104 to the chamber 103c (e.g., turn off the gas-supplying unit 104). In some embodiments, the predetermined temperature is about −10° C. or 95° C. In some embodiments, the predetermined range of temperatures is between −12° C. and −8° C., or between 93° C. and 98° C.

In some embodiments, when the first temperature is substantially greater than or less than the predetermined temperature or is outside of the predetermined range of temperatures, the feedback signal is transmitted to the gas-supplying unit 104 to instruct the gas-supplying unit 104 to continue the discharge of the gas from the gas-supplying unit 104 or adjust a parameter of the gas (e.g., the temperature of the gas, a flow rate of the gas in the conduit 104a, etc.) supplied from the gas-supplying unit 104. In some embodiments, the adjustment of the gas-supplying unit 104 or of the parameter of the gas is performed until the first temperature measured by the temperature-sensing device 105 is substantially equal to the predetermined temperature or within the predetermined range of temperatures.

Figure 15:
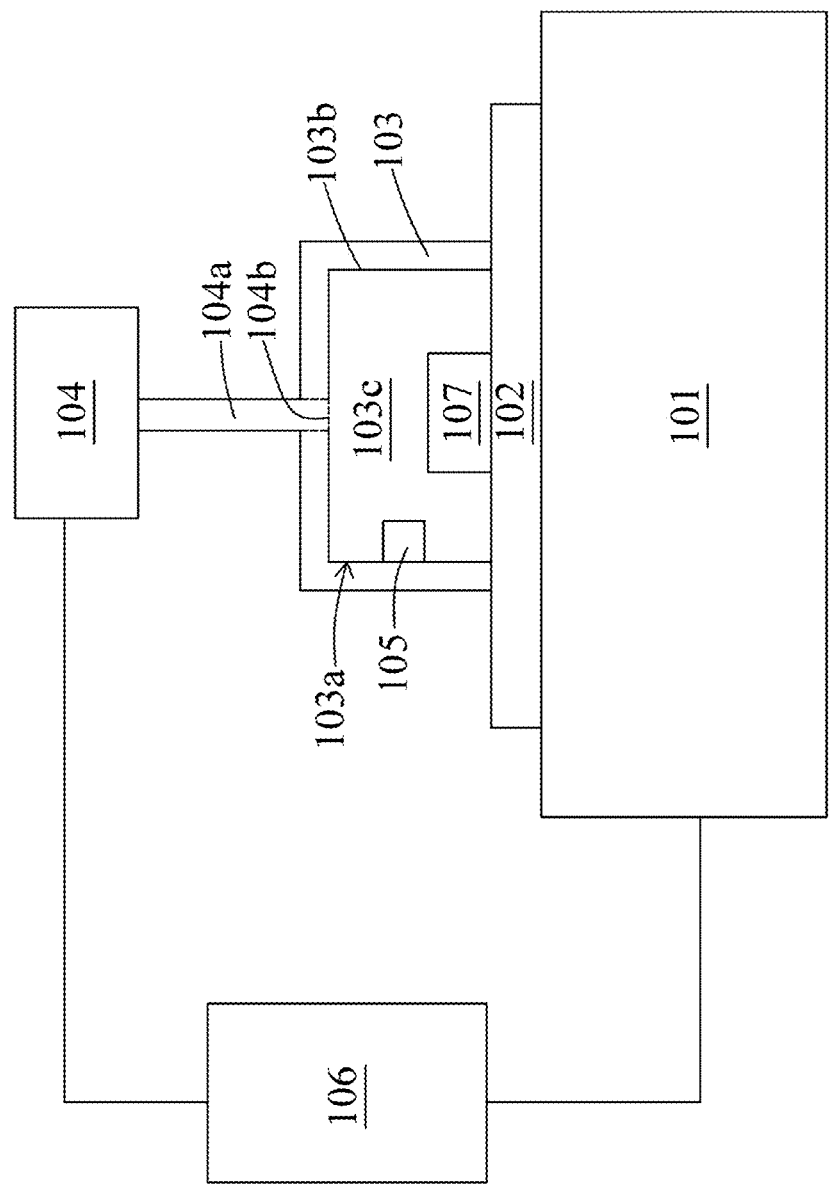
Figure 16:
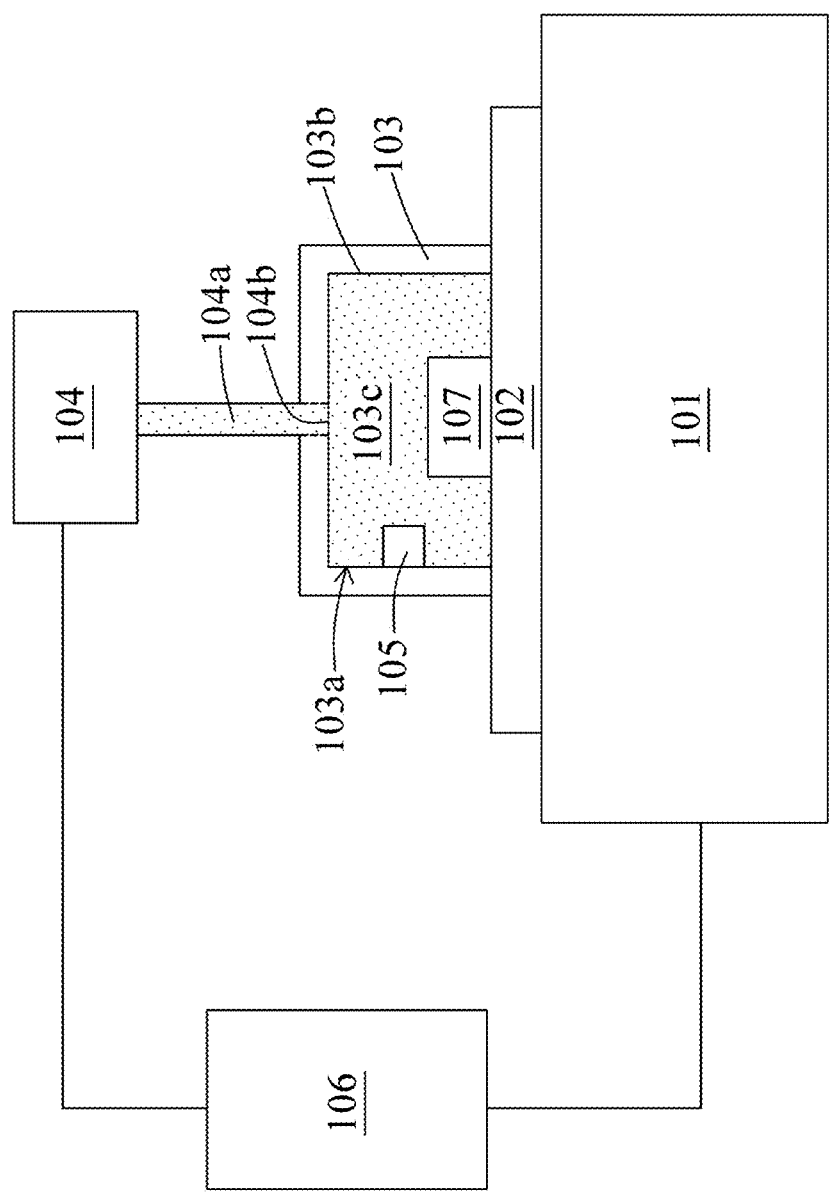

In some embodiments, the semiconductor device 107 is tested by the tester 101 as shown in FIGS. 15 and 16. In some embodiments, a testing signal is transmitted from the tester 101 to the semiconductor device 107 through the interface board 102, and a feedback signal based on the testing signal is transmitted from the semiconductor device 107 to the tester 101 through the interface board 102.

In some embodiments, the testing of the semiconductor device 107 begins when the first temperature is substantially equal to the predetermined temperature or is within the predetermined range of temperatures. In some embodiments, the supplying of the gas from the gas-supplying unit 104 is ceased during the testing of the semiconductor device 107 as shown in FIG. 15. Since the semiconductor device 107 is covered by the shield 103, the chamber 103c can be maintained at or near the first temperature. As such, the semiconductor device 107 can be tested at the first temperature. In other words, the semiconductor device 107 can be tested under specific conditions, such as at the predetermined temperature or pressure.

In some embodiments, the signal indicating the first temperature, the signal indicating the temperature of the gas or the signal indicating the internal temperature of the semiconductor device 107 may be transmitted to the controller 106 during the testing of the semiconductor device 107. Therefore, the controller 106 can monitor the first temperature (the temperature inside the chamber 103c), the temperature of the gas, and the internal temperature of the semiconductor device 107 in real time, and can provide the feedback signal to the gas-supplying unit 104 accordingly to adjust the gas-supplying unit 104 in real time. For example, when the first temperature drops (e.g., to less than the predetermined temperature), the controller 106 can transmit the feedback signal to the gas-supplying unit 104 to turn on the gas-supplying unit 104 and discharge the gas into the chamber 103c.

In some embodiments, the supplying of the gas from the gas-supplying unit 104 and the testing of the semiconductor device are performed simultaneously. In some embodiments, the supplying of the gas from the gas-supplying unit 104 continues during the testing of the semiconductor device 107 as shown in FIG. 16. In some embodiments, the signal indicating the first temperature, the signal indicating the temperature of the gas, or the signal indicating the internal temperature of the semiconductor device 107 may be transmitted to the controller 106 during the testing of the semiconductor device 107. Therefore, the controller 106 can monitor the first temperature (the temperature inside the chamber 103c), the temperature of the gas and the internal temperature of the semiconductor device 107 in real time.

Figure 17:
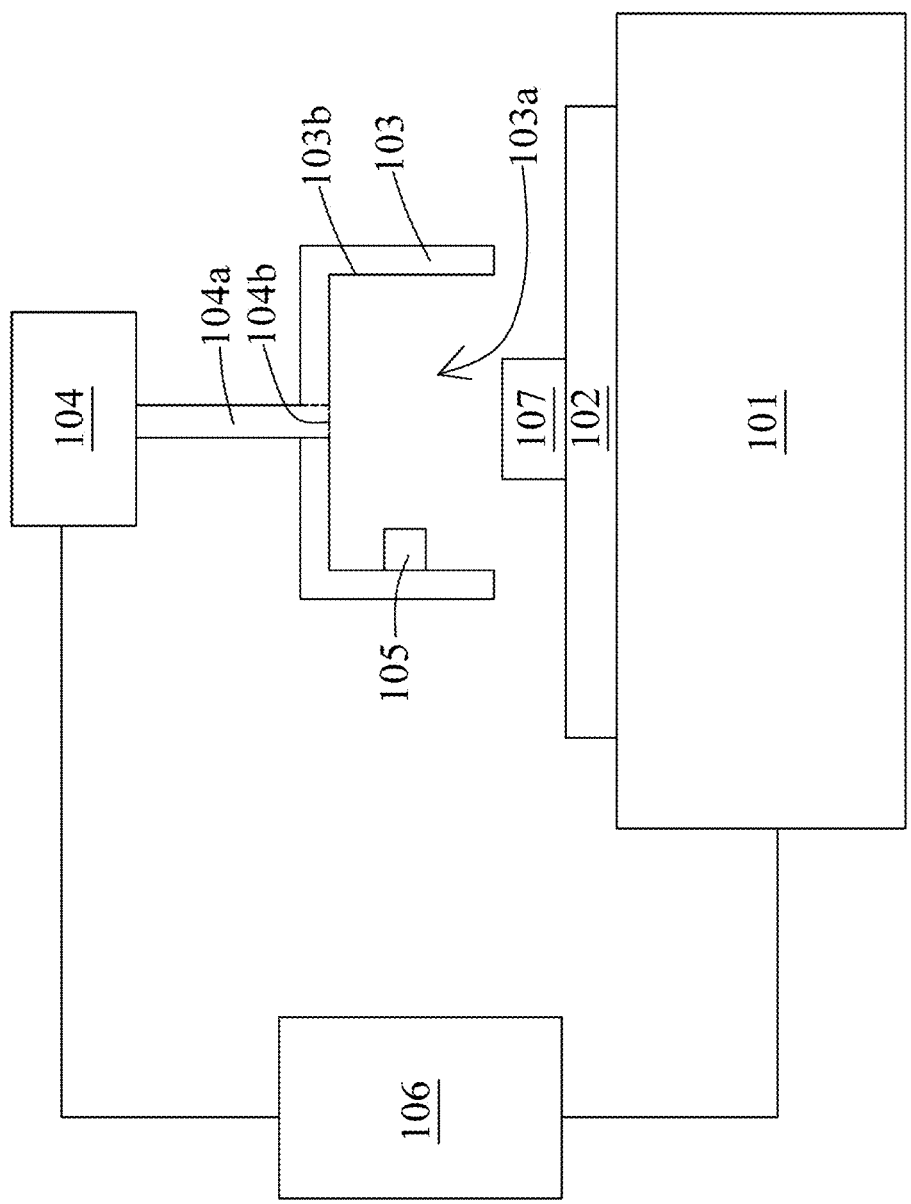
Figure 18:
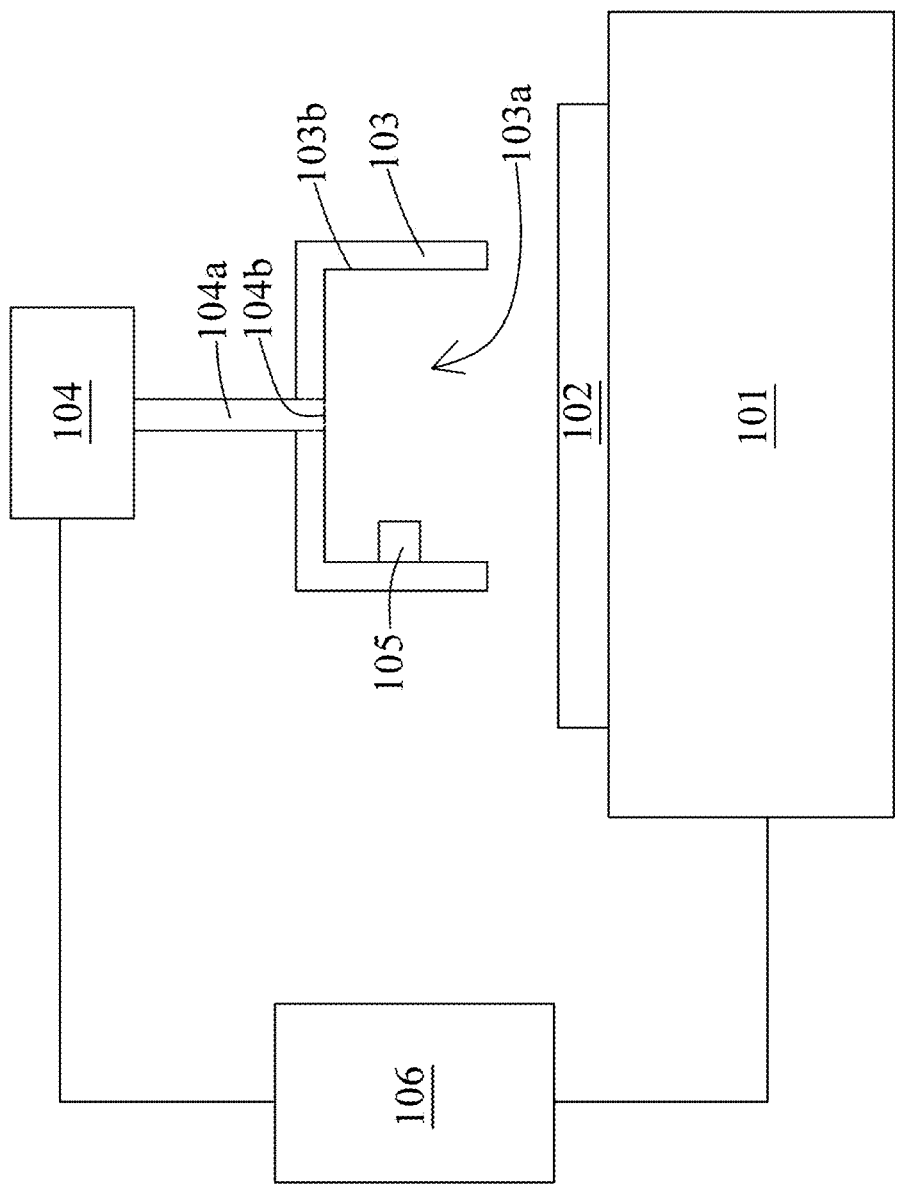

In some embodiments, after the testing of the semiconductor device 107, the shield 103 is moved away from the semiconductor device 107 and the interface board 102 as shown in FIG. 17. In some embodiments, after the shield 103 is moved away from the semiconductor device 107 to form the open configuration, the semiconductor device 107 is unloaded from the interface board 102 as shown in FIG. 18. The semiconductor device 107 is removed from the first apparatus 100.

Figure 19:
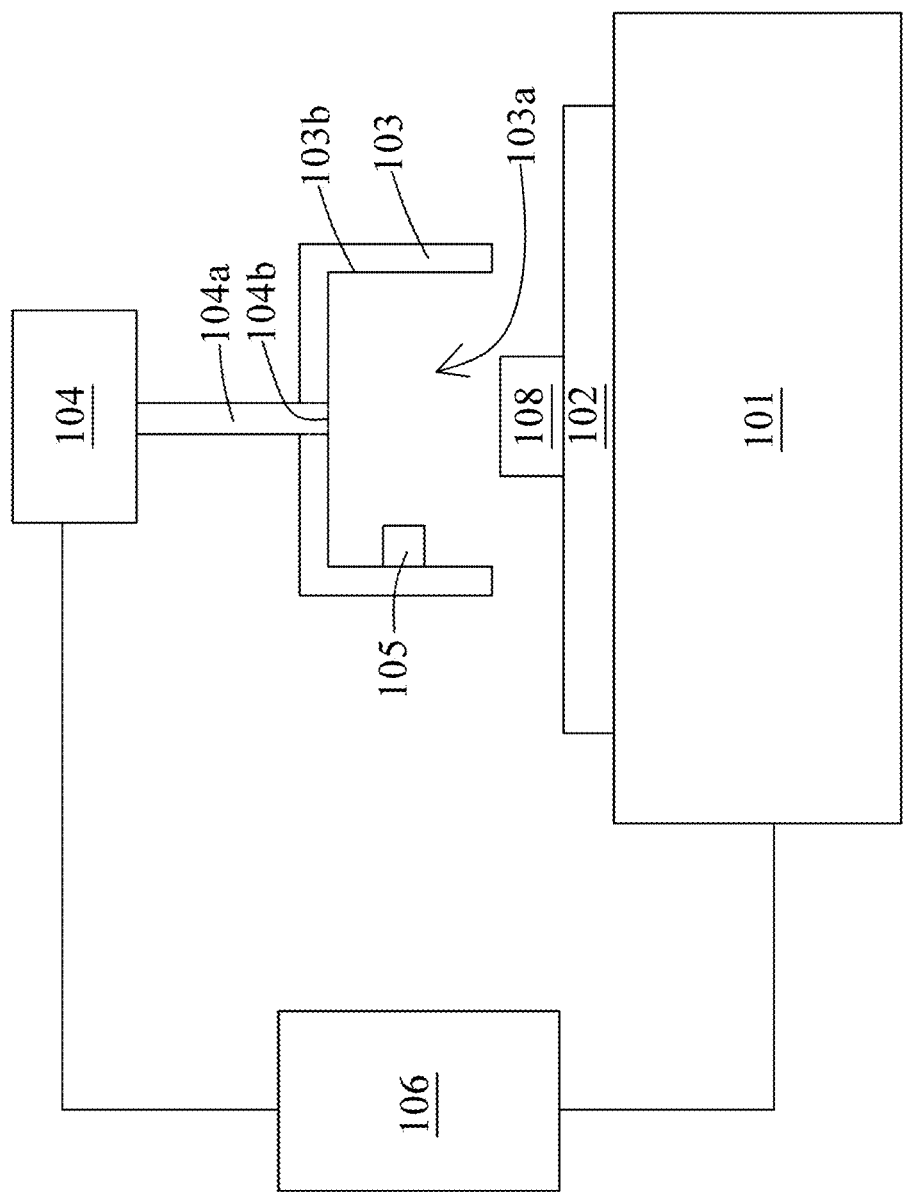
Figure 20:
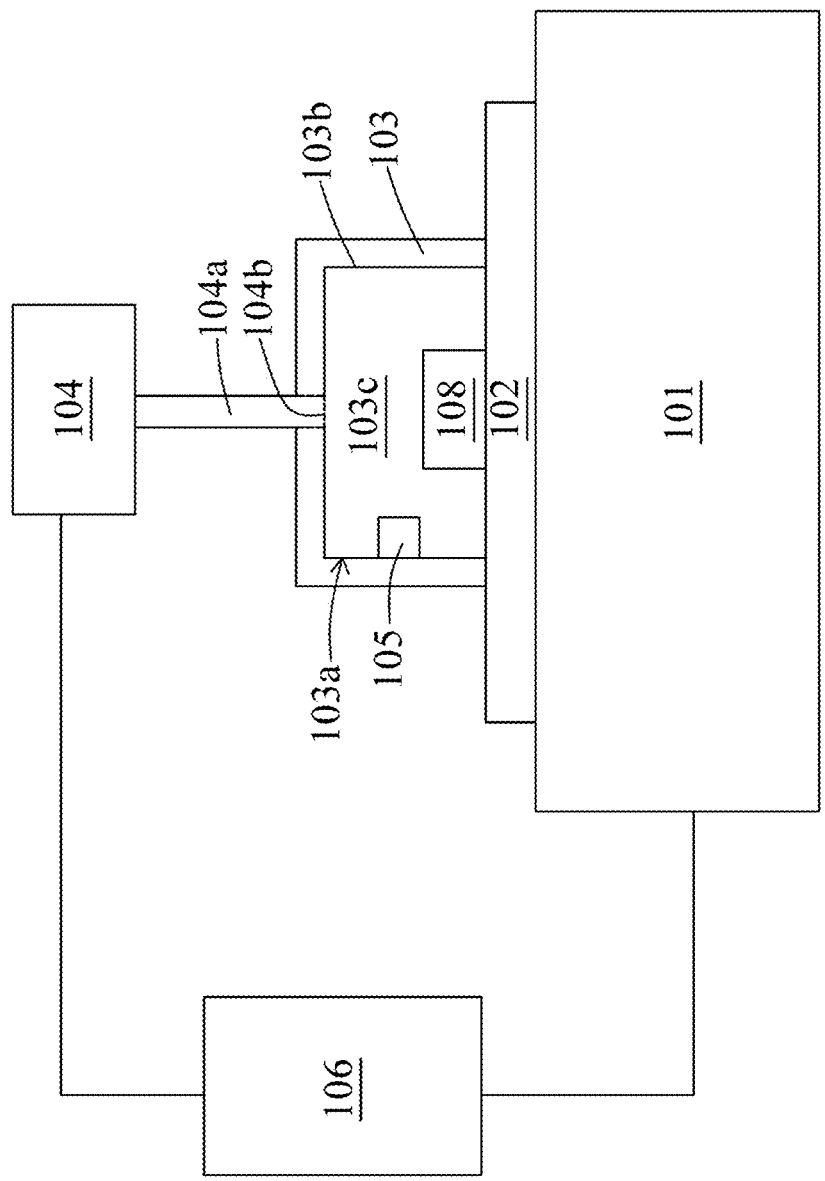

After the unloading of the semiconductor device 107, another semiconductor device 108 is loaded to the interface board 102 as shown in FIG. 19, in a manner similar to that in the step S702. In some embodiments, the other semiconductor device 108 is similar to the semiconductor device 107. In some embodiments, after the loading of the other semiconductor device 108, the shield 103 is moved toward the interface board 102 as shown in FIG. 20, in a manner similar to that in the step S703.

Figure 21:
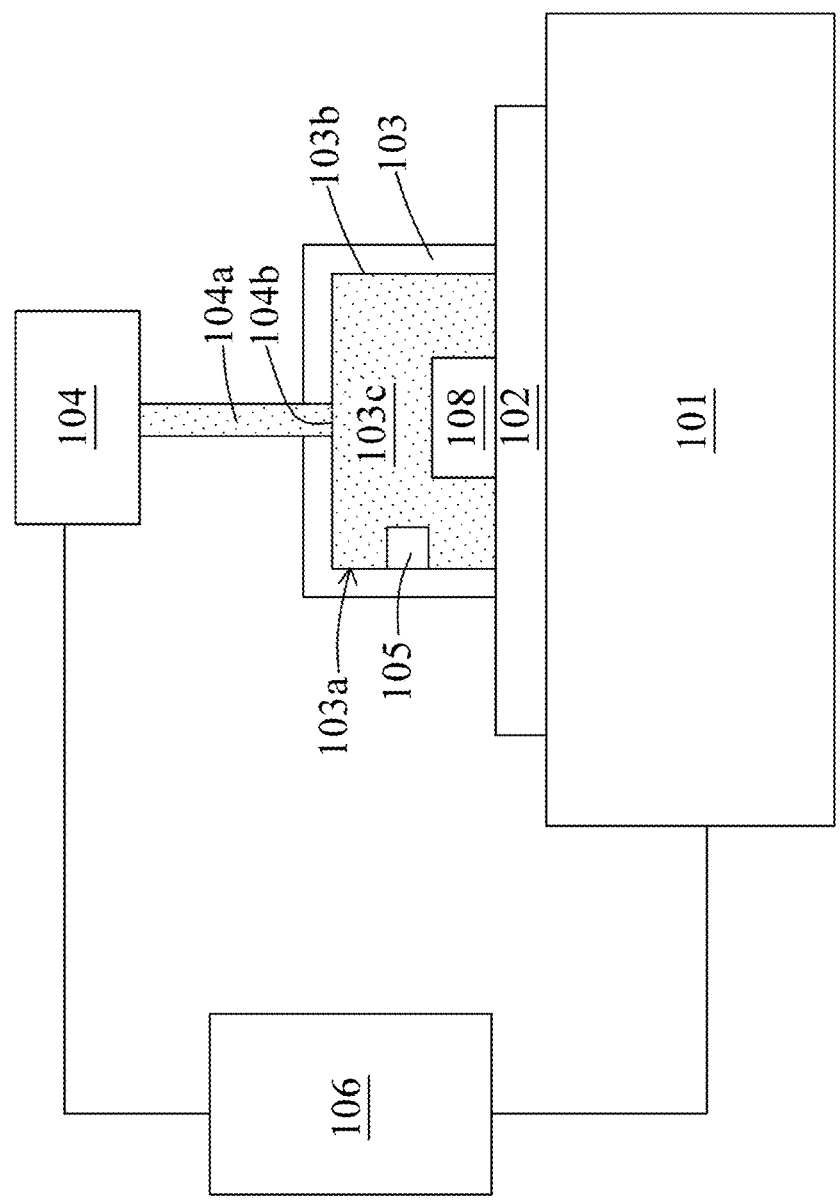

In some embodiments as shown in FIG. 21, after the disposing of the shield 103 on the interface board 102, the gas is supplied from the gas-supplying unit 104 to the chamber 103c, a second temperature of the chamber 103c is measured by the temperature-sensing device 105 and the measurement of the second temperature is transmitted from the temperature-sensing device 105 to the controller 106, in a manner similar to that of the steps S704 through S706. In some embodiments, the other semiconductor device 108 is tested by the tester 101, in a manner similar to the manner described above or illustrated in FIGS. 15 and 16.

In some embodiments, after the testing of the other semiconductor device 108, the shield 103 is moved away from other semiconductor device 108 and the interface board 102, and then the other semiconductor device 108 is unloaded from the interface board 102.

In conclusion, a temperature-sensing device functions to measure a temperature inside a chamber surrounding a semiconductor device, and thus the temperature measured by the temperature-sensing device can be provided to a controller in real time to ensure that the semiconductor device is at a predetermined temperature before or during the testing. Therefore, accuracy of the testing result can be improved.

One aspect of the present disclosure provides an apparatus for testing a semiconductor device. The semiconductor device includes a tester; an interface board disposed over the tester and configured to receive the semiconductor device and connect the semiconductor device to the tester; a shield disposed over the interface board and including a recess; a gas-supplying unit including a conduit extending through the shield and accessible to the recess; a temperature-sensing device disposed within the recess; and a controller configured to control and communicate with the tester, the gas-supplying unit and the temperature-sensing device.

One aspect of the present disclosure provides a method of testing a semiconductor device. The method includes steps of providing a tester, an interface board on the tester, a shield over the interface board, a gas-supplying unit, a temperature-sensing device, and a controller that can communicate with the tester, the gas-supplying unit and the temperature-sensing device; disposing the semiconductor device on the interface board; disposing the shield over the semiconductor device to define a chamber; supplying a gas from the gas-supplying unit to the chamber; measuring a first temperature of the chamber by the temperature-sensing device; and transmitting the measurement of the first temperature from the temperature-sensing device to the controller.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. An apparatus for testing a semiconductor device, comprising:
    a tester, obtaining a testing signal;
    an interface board disposed over the tester and configured to receive the semiconductor device and electrically connect to the semiconductor device and the tester, wherein the testing signal is transmitted from the tester to the semiconductor device through the interface board, the semiconductor device generates a feedback signal based on the testing signal received, and the feedback signal is transmitted from the semiconductor device to the tester through the interface board;
    a shield disposed over the interface board and including a recess;
    a gas-supplying unit including a conduit extending through the shield and accessible to the recess;
    a temperature-sensing device disposed within the recess and exposed to the recess of the shield, wherein the temperature-sensing device is electrically connected to the gas-supplying unit; and
    a controller configured to control and communicate with the tester, the gas-supplying unit and the temperature-sensing device; wherein the temperature-sensing device measures a temperature of the recess and transmits a signal indicating a measured temperature of the recess to the controller;
    wherein the controller transmits a control signal to the gas-supplying unit according to the signal indicating the measured temperature of the recess to adjust a temperature or a flow rate of a gas flowable from the gas-supplying unit to the recess of the shield.

2. The apparatus of claim 1, wherein the temperature-sensing device is attached to an interior sidewall of the shield.

3. The apparatus of claim 1, wherein the semiconductor device is disposed on the interface board, and the conduit is disposed above the semiconductor device.

4. The apparatus of claim 1, wherein the gas is flowable from the gas-supplying unit to the recess through the conduit.

5. The apparatus of claim 4, wherein the gas is dry clean air (DCA) at a predetermined temperature.

6. The apparatus of claim 5, wherein the predetermined temperature is between about −50° C. and about 120° C.

7. The apparatus of claim 1, wherein the temperature-sensing device is a thermocouple, a temperature sensor, a thermistor or a resistive temperature detector.

8. A method of testing a semiconductor device, comprising:
    providing a tester, an interface board on the tester, a shield over the interface board, a gas-supplying unit, a temperature-sensing device, and a controller communicable with the tester, the gas-supplying unit and the temperature-sensing device; wherein the temperature-sensing device is disposed within a recess of the shield and exposed to the recess of the shield, wherein the temperature-sensing device is electrically connected to the gas-supplying unit;
    disposing the semiconductor device on the interface board, wherein the interface board electrically connects to the semiconductor device and the tester;
    transmitting a testing signal from the tester to the semiconductor device through the interface board;
    transmitting a feedback signal based on the testing signal received to from the semiconductor device to the tester through the interface board;
    disposing the shield over the semiconductor device to define a chamber;
    supplying a gas from the gas-supplying unit to the chamber;
    measuring a first temperature of the chamber by the temperature-sensing device; and
    transmitting the measurement of the first temperature of the chamber from the temperature-sensing device to the controller;
    transmitting a control signal to the gas-supplying unit according to the measurement of the first temperature of the chamber;

adjusting a temperature or a flow rate of the gas flowable from the gas-supplying unit to the recess of the shield.

9. The method of claim 8, further comprising testing the semiconductor device by the tester when the first temperature is substantially equal to a predetermined temperature or is within a predetermined range of temperatures.

10. The method of claim 9, wherein the supplying of the gas and the testing of the semiconductor device are performed simultaneously.

11. The method of claim 9, wherein the predetermined temperature is about −10° C. or 95° C.

12. The method of claim 9, wherein the predetermined range of temperatures is between −12° C. and −8° C. or between 93° C. and 98° C.

13. The method of claim 9, further comprising moving the shield away from the semiconductor device after the testing of the semiconductor device.

14. The method of claim 8, wherein adjusting the temperature or the flow rate of the gas from the gas-supplying unit when the first temperature is substantially greater than or less than a predetermined temperature or is outside of a predetermined range of temperatures.

15. The method of claim 8, further comprising:
measuring a second temperature of the chamber by the temperature-sensing device;
transmitting the measurement of the second temperature of the chamber from the temperature-sensing device to the controller through the gas-supplying unit.

16. The method of claim 15, further comprising testing the semiconductor device by the tester when the second temperature is substantially equal to a predetermined temperature or is within a predetermined range of temperatures.

17. The method of claim 16, wherein the supplying of the gas and the testing of the semiconductor device are performed simultaneously.

18. The method of claim 15, wherein adjusting the temperature or the flow rate of the gas from the gas-supplying unit when the second temperature is substantially greater than or less than a predetermined temperature or is outside of a predetermined range of temperatures.

19. The method of claim 8, wherein the disposing of the shield includes moving the shield toward the semiconductor device until the shield touches the interface board or the tester.

20. The method of claim 8, further comprising:
obtaining an internal temperature of the semiconductor device from the interface board or the tester;
transmitting the internal temperature of the semiconductor device from the tester to the controller.

* * * * *